(12) United States Patent
Shiigi et al.

(10) Patent No.: US 10,784,256 B2
(45) Date of Patent: Sep. 22, 2020

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Takashi Shiigi, Matsumoto (JP); Shoji Yamada, Matsumoto (JP); Yuichi Harada, Matsumoto (JP); Yasuyuki Hoshi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 418 days.

(21) Appl. No.: 15/282,215

(22) Filed: Sep. 30, 2016

(65) Prior Publication Data

US 2017/0111037 A1 Apr. 20, 2017

(30) Foreign Application Priority Data

Oct. 19, 2015 (JP) .................................. 2015-205337
Jun. 3, 2016 (JP) .................................. 2016-111758

(51) Int. Cl.
*H01L 27/07* (2006.01)
*H01L 29/78* (2006.01)
(Continued)

(52) U.S. Cl.
CPC ...... *H01L 27/0705* (2013.01); *H01L 21/4853* (2013.01); *H01L 23/49844* (2013.01);
(Continued)

(58) Field of Classification Search
CPC ......... H01L 21/4853; H01L 21/823487; H01L 27/0705; H01L 27/088; H01L 29/7802
See application file for complete search history.

(56) References Cited

U.S. PATENT DOCUMENTS 6,054,752 A * 4/2000 Hara ................... H01L 29/0611
257/629
6,184,061 B1 * 2/2001 Wu ..................... H01L 21/4853
257/E21.508

(Continued)

FOREIGN PATENT DOCUMENTS

| JP | 2012199385 A | 10/2012 |
|----|--------------|---------|
| JP | 2014-099444 A | 5/2014 |
| JP | 2014120638 A | 6/2014 |

OTHER PUBLICATIONS

"Channel Length vs Gate Length". Dec. 20, 2015. <http://vlsi-soc.blogspot.com/2015/12/channel-length-vs-gate-length.html>. (Year: 2015).*

(Continued)

*Primary Examiner* — Jared Fureman
*Assistant Examiner* — Christopher J Clark
(74) *Attorney, Agent, or Firm* — Rabin & Berdo, P.C.

(57) ABSTRACT

A semiconductor device includes a plurality of semiconductor switching elements disposed on a single semiconductor substrate comprising a semiconductor having a bandgap that is wider than that of silicon; and a plurality of electrode pads that are disposed in a predetermined planar layout on a front surface of the semiconductor substrate, the plurality of electrode pads each being electrically connected to the plurality of semiconductor switching elements. A plurality of terminal pins to externally carry out voltage of the electrode pads is bonded through a plated film to all of the plurality of electrode pads by solder.

15 Claims, 17 Drawing Sheets

(51) Int. Cl.
*H01L 27/088* (2006.01)
*H01L 23/00* (2006.01)
*H01L 21/48* (2006.01)
*H01L 23/498* (2006.01)
*H01L 23/535* (2006.01)
*H01L 29/16* (2006.01)
*H01L 27/092* (2006.01)
*H01L 29/861* (2006.01)
*H01L 21/8234* (2006.01)
*H01L 29/10* (2006.01)
*H03K 17/081* (2006.01)
*H03K 17/08* (2006.01)

(52) U.S. Cl.
CPC ............ *H01L 23/535* (2013.01); *H01L 24/06* (2013.01); *H01L 24/09* (2013.01); *H01L 27/088* (2013.01); *H01L 29/1608* (2013.01); *H01L 29/7802* (2013.01); *H01L 21/823487* (2013.01); *H01L 27/0922* (2013.01); *H01L 29/1095* (2013.01); *H01L 29/16* (2013.01); *H01L 29/861* (2013.01); *H01L 2224/0603* (2013.01); *H01L 2224/095* (2013.01); *H01L 2224/0912* (2013.01); *H01L 2924/10272* (2013.01); *H01L 2924/13055* (2013.01); *H01L 2924/13091* (2013.01); *H03K 17/08104* (2013.01); *H03K 2017/0806* (2013.01)

(56) References Cited

U.S. PATENT DOCUMENTS

| | | | |
|---|---|---|---|
| 6,336,269 B1* | 1/2002 | Eldridge | B23K 20/004 228/180.5 |
| 9,419,133 B2* | 8/2016 | Kinoshita | H01L 29/872 |
| 9,997,603 B2* | 6/2018 | Hoshi | H01L 21/0465 |
| 2011/0304387 A1* | 12/2011 | Hirashiki | G05F 3/262 327/542 |
| 2013/0049137 A1* | 2/2013 | Uno | H01L 27/088 257/401 |
| 2015/0333060 A1* | 11/2015 | Decker | H01L 27/088 257/392 |
| 2016/0079377 A1* | 3/2016 | Hutzler | H01L 29/407 257/334 |
| 2017/0089957 A1* | 3/2017 | Takada | G01R 17/16 |
| 2017/0110544 A1* | 4/2017 | Hoshi | H01L 29/1608 |
| 2017/0179012 A1* | 6/2017 | Shimodaira | H01L 21/4853 |

OTHER PUBLICATIONS

Krishna Shenai et al., "Optimum Semiconductors for High-Power Electronics", IEEE Transactions on Electron Devices, vol. 36, No. 9, pp. 1811-1823, Sep. 1989.

B. Jayant Baliga, "Silicon Carbide Power Devices", U.S.A, World Scientific Publishing Co., pp. 60-69, Mar. 30, 2006.

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Applications No. 2015-205337, filed on Oct. 19, 2015, and No. 2016-111758, filed on Jun. 3, 2016, the entire contents of which are incorporated herein by reference.

BACKGROUND OF THE INVENTION

1. Field of the Invention

The embodiments discussed herein are related to a semiconductor device and method of manufacturing a semiconductor device.

2. Description of the Related Art

Conventionally, silicon (Si) is used as a constituent material of a power semiconductor device that controls high voltage and/or large current. There are several types of power semiconductor devices such as bipolar transistors, insulated-gate bipolar transistors (IGBTs), and metal oxide semiconductor field effect transistors (MOSFETs). These devices are selectively used according to intended purpose.

For example, bipolar transistors and IGBTs have high current density compared to MOSFETs, and can be adapted for large current but cannot be switched at high speed. In particular, the limit of switching frequency is about several kHz for bipolar transistors and about several tens of kHz for IGBTs. On the other hand, power MOSFETs have low current density compared to bipolar transistors and IGBTs, and are difficult to be adapted for large current but can be switched at high speed up to about several MHz.

However, there has been a strong demand in the market for a power semiconductor device achieving both large current and high speed. Thus, IGBTs and power MOSFETs have been intensively developed and improved, and the performance of power devices has substantially reached the theoretical limit determined by the material. In terms of power semiconductor devices, semiconductor materials replacing silicon have been investigated and silicon carbide (SiC) has been focused on as a semiconductor material enabling production (manufacture) of a next-generation power semiconductor device with low on voltage, high-speed characteristics, and high-temperature characteristics (see, for example, K. Shenai, et al, "Optimum Semiconductors for High-Power Electronics", IEEE Transactions on Electron Devices, September 1989, Vol. 36, No. 9, pages 1811-1823).

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and thus is expected to be a semiconductor material that can sufficiently reduce on-resistance. These merits of silicon carbide are common to other wide bandgap semiconductors with a bandgap greater than silicon (hereinafter, referred to as "wide bandgap semiconductor"), such as gallium nitride (GaN). Thus, a high-voltage semiconductor device can be achieved by using a wide bandgap semiconductor (see, for example, B. Jayant Baliga, "Silicon Carbide Power Devices", U.S.A, World Scientific Publishing Co., Mar. 30, 2006, page 61).

With such a high-voltage semiconductor device using silicon carbide, loss occurring at the high-voltage semiconductor device is reduced; however, a carrier frequency that is ten times that of a conventional semiconductor device using silicon or greater is applied to the high-voltage semiconductor device when being used in an inverter. When a semiconductor device is used for high frequency applications, the temperature of generated heat emitted to the chip increases and affects the reliability of the semiconductor device. In particular, a bonding machine (a bonder) connects bonding wires to front surface electrodes on a front surface of a semiconductor chip. When the semiconductor device is used at high temperatures, the adhesion of the front surface electrodes and the bonding wires drops, thereby adversely affecting the reliability.

According to another proposed wiring structure, a flat plate-like wire member forming an external connection terminal to carry out the voltage of the front surface electrode is bonded to the front surface electrode instead of the bonding wire (see, for example, Japanese Laid-Open Patent Publication No. 2014-099444 (paragraphs 0032 to 0034)). In Japanese Laid-Open Patent Publication No. 2014-099444, the heat dissipation efficiency is improved by making the heat capacity of the wire member to be greater than the heat capacity of the bonding wire, and increasing the area of contact with the semiconductor chip.

According to another proposed wiring structure, a pin-like wire member forming an external connection terminal (hereinafter, referred to as "terminal pin") is bonded to a front surface electrode to be substantially perpendicular to the front surface of a chip.

In a MOSFET having a conventional configuration, when voltage that is positive relative to a source electrode is applied to a drain electrode and voltage lower than a threshold voltage is applied to the gate electrode, a pn-junction between a p-type base region and an n-type JFET region is reversely biased, and reverse-direction breakdown voltage of the active region is prevented and no current flows. On the other hand, when voltage equal to or higher than the threshold voltage is applied to the gate electrode, an n-type inversion layer (a channel) is formed in the surface layer of a portion immediately beneath the gate electrode (on the drain side) of the p-type base region. Current thereby flows through an $n^+$-type silicon carbide substrate, an $n^-$-type silicon carbide layer, the n-type JFET region, a surface inversion layer of the p-type base region, and an $n^+$-type source region. Thus, switching operation of a known MOSFET may be executed by controlling the gate voltage.

SUMMARY OF THE INVENTION

According to one aspect of the invention, a semiconductor device includes a plurality of semiconductor switching elements disposed on a single semiconductor substrate comprising a semiconductor material having a bandgap that is wider than that of silicon; and a plurality of electrode pads that are disposed in a predetermined planar layout on a front surface of the semiconductor substrate, the plurality of electrode pads each being electrically connected to the plurality of semiconductor switching elements. A plurality of terminal pins to externally carry out voltage of the electrode pads is bonded through a plated film to all of the plurality of electrode pads by solder.

In the semiconductor device, the plurality of semiconductor switching elements include: a first semiconductor element executing a main operation; and one or more second semiconductor elements protecting or controlling the first semiconductor element.

The semiconductor device has a planar layout in which some of the electrode pads electrically connected to the plurality of second semiconductor elements are disposed in a central portion of an active region through which main electric current flows.

In the semiconductor device, two or more of the second semiconductor elements are disposed, and the semiconductor device has a planar layout in which some of the electrode pads electrically connected to the two or more of the second semiconductor elements are disposed in one row in a straight line.

In the semiconductor device, two or more of the second semiconductor elements are disposed, and the semiconductor device has a planar layout in which some of the electrode pads electrically connected to the two or more of the second semiconductor elements are divided and disposed at two positions sandwiching one of the electrode pads electrically connected to the first semiconductor element.

In the semiconductor device, one of the second semiconductor elements is one of a first over voltage protection region protecting the first semiconductor element from over voltage; a current sensing region detecting current flowing through the first semiconductor element; a temperature sensing region detecting a temperature of the first semiconductor element; and a computing circuit region controlling the first semiconductor element.

In the semiconductor device, the first semiconductor element includes: a first semiconductor region of a second conductivity type, disposed on a front surface side of the semiconductor substrate of a first conductivity type; a second semiconductor region of the first conductivity type, selectively disposed in the first semiconductor region; a gate insulating film disposed so as to contact the first semiconductor region, at a region between the second semiconductor region and the semiconductor substrate; a gate electrode disposed on a side opposite the first semiconductor region, sandwiching the gate insulating film therebetween; a first electrode disposed so as to contact the first semiconductor region and the second semiconductor region; and a second electrode disposed so as to contact a back surface of the semiconductor substrate. The first electrode is one of the electrode pads electrically connected to the first semiconductor element, among the plurality of electrode pads.

In the semiconductor device, the semiconductor material having a bandgap that is wider than that of silicon is silicon carbide.

In the semiconductor device, an element structure of the first semiconductor element and an element structure of the second semiconductor element to be the current sensing region are disposed at a predetermined pitch.

In the semiconductor device, the element structure of the second semiconductor element to be the current sensing region is made up of a portion of the element structure of the first semiconductor element.

In the semiconductor device, the element structure of the first semiconductor element is an insulated gate structure. The element structure of the second semiconductor element to be the current sensing region is an insulated gate structure. A channel length of the element structure of the second semiconductor element to be the current sensing region is set such that the element structure of the second semiconductor element to be the current sensing region and the element structure of the first semiconductor element have a same gate threshold voltage.

In the semiconductor device, the first semiconductor element includes: a first semiconductor region of a second conductivity type, disposed on a front surface side of the semiconductor substrate of a first conductivity type; a second semiconductor region of the first conductivity type, selectively disposed in the first semiconductor region; a gate insulating film disposed contacting the first semiconductor region, at a region between the second semiconductor region and the semiconductor substrate; a gate electrode disposed on a side opposite of the first semiconductor region, sandwiching the gate insulating film therebetween; a first electrode contacting the first semiconductor region and the second semiconductor region; and a second electrode contacting a back surface of the semiconductor substrate. The first electrode is one of the electrode pads electrically connected to the first semiconductor element, among the plurality of electrode pads.

In the semiconductor device, the first semiconductor region and the second semiconductor region are disposed in a predetermined layout to face, in a depth direction, one of the electrode pads electrically connected to the first semiconductor element and some of the electrode pads electrically connected to the plurality of second semiconductor elements, among the plurality of electrode pads.

In the semiconductor device, the current sensing region is made up of a portion of the first semiconductor region and the second semiconductor region, facing in the depth direction, one of the electrode pads electrically connected to the second semiconductor element to be the current sensing region.

In the semiconductor device, the first semiconductor element further includes a third semiconductor region selectively disposed at a position deeper than the first semiconductor region from the front surface of the semiconductor substrate, the third semiconductor region contacting the first semiconductor region. The third semiconductor region is disposed to be adjacent to a portion of the first semiconductor region to be the current sensing region.

In the semiconductor device, a fourth semiconductor region of a conductivity type different from that of the third semiconductor region is selectively disposed in the third semiconductor region.

According to another aspect of the invention, a method of manufacturing a semiconductor device that includes a plurality of semiconductor switching elements disposed on a single semiconductor substrate comprising a semiconductor having a bandgap that is wider than that of silicon, and a plurality of electrode pads electrically connected to each among the plurality of semiconductor switching elements, includes: forming element structures of the plurality of semiconductor switching elements on a front surface of the semiconductor substrate; forming on the front surface of the semiconductor substrate, a metal film so as to contact a contact region of the plurality of element structures; forming in a predetermined planar layout on the front surface of the semiconductor substrate, the plurality of electrode pads electrically connected to the plurality semiconductor switching elements, the plurality of electrode pads formed by selectively removing the metal film; and bonding to all among the plurality of electrode pads through a plated film by solder, a plurality of terminal pins that externally carry out voltage of the electrode pads.

Objects, features, and advantages of the present invention are specifically set forth in or will become apparent from the

DETAILED DESCRIPTION OF THE INVENTION

Figure 1:
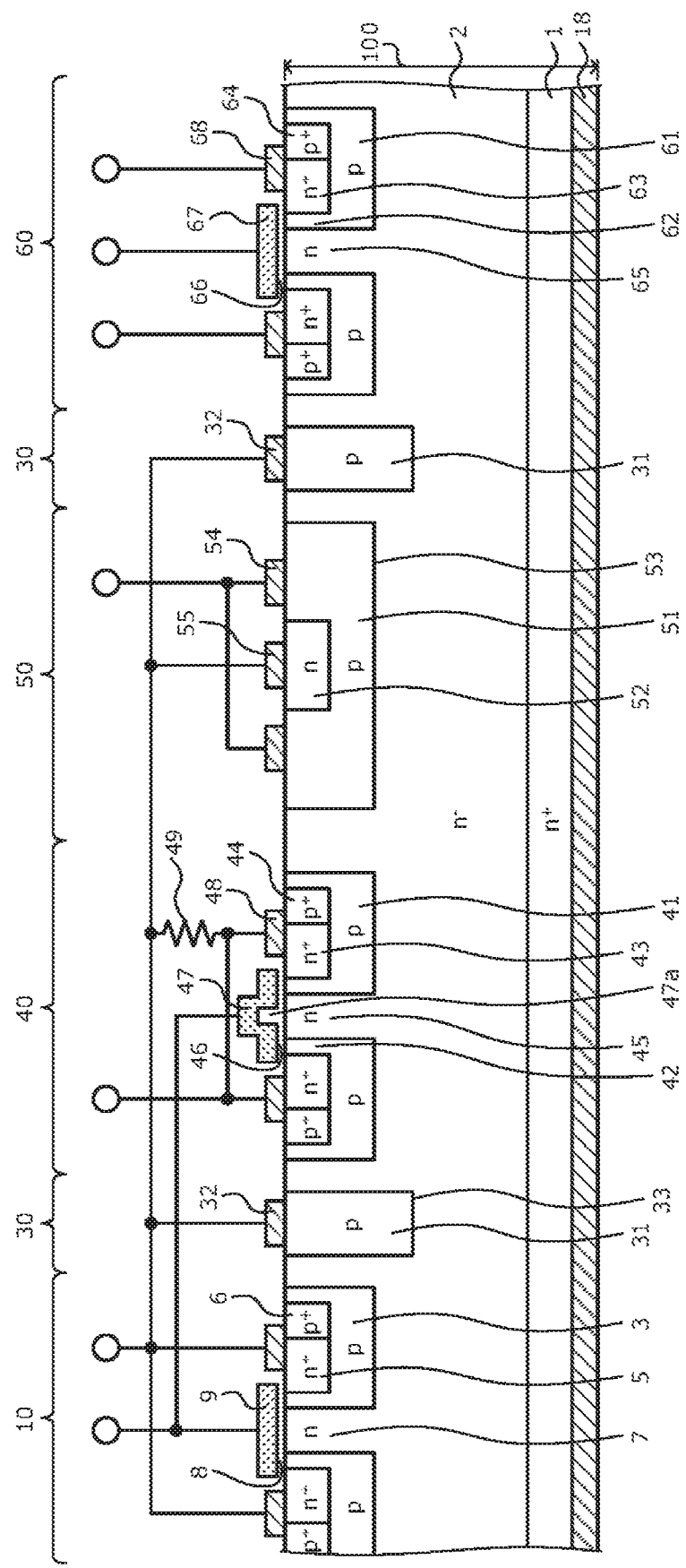
FIG. 1 is a cross-sectional view of an example of a structure of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described. Further, in the present description, when Miller indices are described, "−" means a bar added to an index immediately after the "−", and a negative index is expressed by prefixing "−" to the index.

Figure 2:
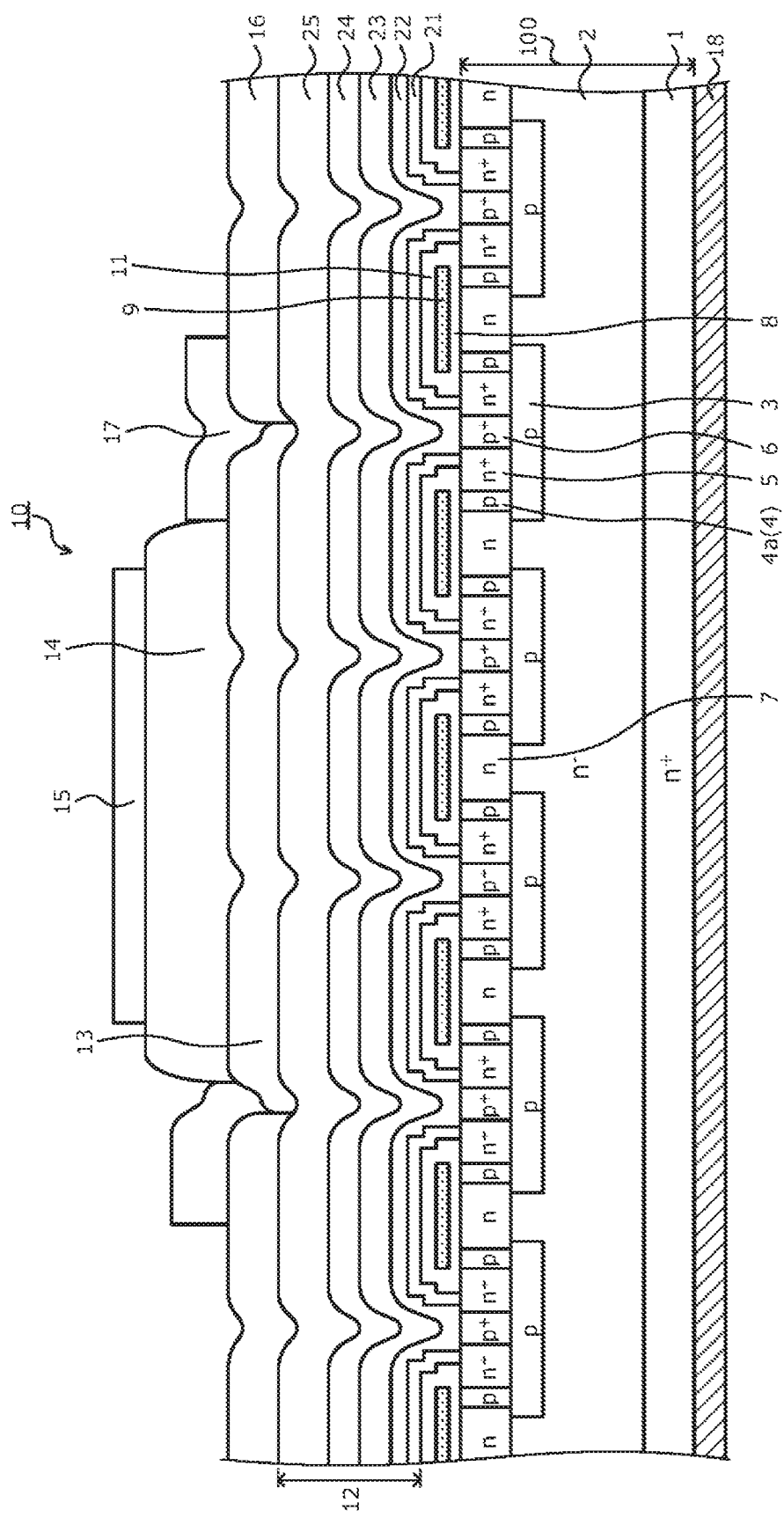
FIG. 2 is a cross-sectional view of a wiring structure of the semiconductor device according to the first embodiment.

The semiconductor device according to the present invention includes a wide bandgap semiconductor. In a first embodiment, a silicon carbide semiconductor device will be described that is manufactured using, for example, silicon carbide (SiC) as the wide bandgap semiconductor. FIG. 1 is a cross-sectional view of an example of a structure of the semiconductor device according to the first embodiment. FIG. 2 is a cross-sectional view of a wiring structure of the semiconductor device according to the first embodiment. FIG. 1 depicts an active region of a semiconductor base body 100 including silicon carbide (hereinafter, referred to as "silicon carbide base body (semiconductor substrate (semiconductor chip))"), and does not depict an edge terminating region surrounding the periphery of the active region. The active region is a region through which current flows during an ON-state. The edge terminating region is a region that mitigates the electric field on the base-body front surface side of a drift region and prevents the breakdown voltage.

As depicted in FIG. 1, the semiconductor device according to the first embodiment includes a main semiconductor switching element (a first semiconductor element) 10 and plural circuit regions (second semiconductor elements) that protect and control the main semiconductor switching element 10 in the active region of the one same silicon carbide base body 100. Examples of the circuit regions to protect and control the main semiconductor switching element 10 include, for example, an over voltage protection region (a first over voltage protection region) 30, a current sensing region 40, a temperature sensing region 50, and a computing circuit region 60. The main semiconductor switching element 10 and the circuit regions to protect and control the main semiconductor switching element 10 each have a wiring structure of the same configuration using a pin-like wire member (a terminal pin 15 described later). The wiring structure of the semiconductor device according to the first embodiment will be described with reference to FIGS. 1 and 2 taking, as an example, a case where the main semiconductor switching element 10 is a vertical MOSFET having a planar gate structure.

The main semiconductor switching element 10 includes a MOS gate structure region that includes a first and a second p-type base regions 3 and 4a, an n$^+$-type source region (a second semiconductor region) 5, a p$^+$-type contact region (first semiconductor region) 6, an n-type JFET region 7, a gate insulating film 8, and a gate electrode 9, on the front surface side (the surface on the p-type silicon carbide layer side described later) of the silicon carbide base body 100. One MOS gate structure region constitutes one region cell (a functional region of an element). Although not depicted, plural MOS gate structure regions are disposed in a planar layout, for example, of stripes extending along a direction parallel to the front surface of the base body. Plural region cells are disposed adjacent to each other. The main semiconductor switching element 10 includes plural (for example, about several hundred to about several 10 thousand) region cells disposed adjacent to each other.

For example, the silicon carbide base body 100 includes, for example, an n$^-$-type semiconductor layer (an n$^-$-type silicon carbide layer) 2 including silicon carbide and a p-type semiconductor layer (a p-type silicon carbide layer) 4 including silicon carbide that are sequentially stacked on the front surface of an n$^+$-type supporting substrate (an n$^+$-type silicon carbide substrate) 1 including silicon carbide. The n$^+$-type silicon carbide substrate 1 functions as a drain region of the main semiconductor switching element 10. A first p-type base region 3 is selectively disposed in the surface layer of the n$^-$-type silicon carbide layer 2, on the side opposite the n$^+$-type silicon carbide substrate 1 side (the base-body front surface side). A portion of the n$^-$-type silicon carbide layer 2, excluding the first p-type base region 3 is a drift region.

A p-type silicon carbide layer 4 is disposed on the surface of the n$^-$-type silicon carbide layer 2, on the side opposite the n$^+$-type silicon carbide substrate 1 side, so as to cover the first p-type base region 3. The impurity concentration of the p-type silicon carbide layer 4 may be lower than the impurity concentration of the first p-type base region 3. In the p-type silicon carbide layer 4, an n$^+$-type source region 5 and a p⁺-type contact region 6 are each selectively disposed in a portion facing the first p-type base region 3 in a depth direction. In the p-type silicon carbide layer 4, an n-type semiconductor region 7 is disposed that penetrates the p-type silicon carbide layer 4 in the depth direction and reaches the n⁻-type silicon carbide layer 2.

The n-type semiconductor region 7 is disposed away from the n⁺-type source region 5, on the side of the n⁺-type source region 5 opposite the p⁺-type contact region 6 side. A portion 4a of the p-type silicon carbide layer 4 excluding the n⁺-type source region 5, the p⁺-type contact region 6, and the n-type semiconductor region 7 (hereinafter, referred to as "second p-type base region") functions together with the first p-type base region 3 as the base region. The n-type semiconductor region (hereinafter, referred to as "n-type JFET region") 7 is the JFET (Junction FET) region sandwiched between the adjacent base regions and functions together with the n⁻-type silicon carbide layer 2 as the drift region.

A gate electrode 9 is disposed, through the gate insulating film 8, on the surface of the portion sandwiched by the n⁺-type source region 5 and the n-type JFET region 7, of the second p-type base region 4a. The gate insulating film 8 may be extended on the surface of the n-type JFET region 7 constituting the same single region cell and the gate electrode 9 may be disposed to face the n-type JFET region 7 in the depth direction sandwiching the gate insulating film 8 therebetween. An interlayer insulating film 11 is disposed to cover the gate electrode 9, on the front surface of the silicon carbide base body 100 overall. The n⁺-type source region 5 and the p⁺-type contact region 6 are disposed in a contact hole opened in the interlayer insulating film 11.

A source electrode (a first electrode) 12 contacts the n⁺-type source region 5 and the p⁺-type contact region 6 through the contact hole and is electrically insulated from the gate electrode 9 by the interlayer insulating film 11. The source electrode 12 may have a layered structure formed by stacking plural metal films on each other. FIG. 2 depicts the source electrode 12 having a five-layer structure formed by sequentially stacking a titanium nitride (TiN) film 21, a titanium (Ti) film 22, a titanium nitride film 23, a titanium film 24, and an aluminum (Al) film 25 from the front surface side of the base body. The titanium nitride film 21 covers the interlayer insulating film 11. The titanium nitride film 21 may extend from a position on the interlayer insulating film 11 to a position on the n⁺-type source region 5 in the contact hole, and contact the n⁺-type source region 5.

The titanium film 22 is disposed along the surface of the titanium nitride film 21 and an inner wall of the contact hole, and contacts the n⁺-type source region 5 and the p⁺-type contact region 6 in the contact hole. The titanium nitride film 23 is disposed on the titanium film 22. The titanium film 24 is disposed on the titanium nitride film 23. The titanium nitride film 21, the titanium film 22, the titanium nitride film 23, and the titanium film 24 function as a barrier metal. The barrier metal has a function of preventing diffusion of metal atoms from the source electrode 12 to the silicon carbide base body 100 side and the interlayer insulating film 11. The barrier metal also has a function of preventing mutual reaction between the metal films constituting the barrier metal or between the regions facing each other sandwiching the barrier metal therebetween.

The aluminum film 25 is disposed on the titanium film 24. Instead of the aluminum film 25, for example, an aluminum-silicon (Al—Si) film, an aluminum-silicon-copper (Al—Si—Cu) film, or an aluminum-copper (Al—Cu) film may be disposed. The source electrode 12 acts as the source pad (an electrode pad) of the main semiconductor switching element 10. The terminal pin 15 is bonded to the source electrode 12 through a plated film 13 and a solder film 14. The terminal pin 15 is a wire member having a predetermined diameter and a round bar-like (columnar) shape, and acts as an external connection terminal (for example, an implant pin) to carry out the voltage of the source electrode 12. One end of the terminal pin 15 is exposed on an outer side of a case (not depicted) on which the semiconductor chip (the silicon carbide base body 100) is mounted, and is electrically connected to an external device not depicted. The terminal pin 15 is highly adhesive to the source electrode 12 even under a high temperature condition (for example, 200° C. to 300° C.), and tends to be resistant to peeling compared to wire bonding.

The other end of the terminal pin 15 is bonded using solder to the plated film 13 to be substantially perpendicular to the front surface of the base body. Although FIG. 2 depicts a simplified view of the terminal pin 15, the bar-like terminal pin 15 is in practice bonded to the solder film 14 to have a dimension of length along a vertical direction. The plural terminal pins 15 may be bonded to the source electrode 12. The diameter of each of and the number of the terminal pins 15 to be bonded to the source electrode 12 are determined based on the magnitude of the current capacity of the main semiconductor switching element 10. The current capacity of the main semiconductor switching element 10 increases as the diameter of the terminal pin 15 increases or as the number of terminal pins 15 bonded to the source electrode 12 increases. The surface area of the plated film 13 is substantially equal to the surface area of the end (the bottom face) of the terminal pin 15 when the one terminal pin 15 is bonded to the source electrode 12, and is of a size that enables all the terminal pins 15 to be bonded (=the area of the end of the terminal pin 15×n) when plural (n, n>1) terminal pins 15 are bonded to the source electrode 12.

The portion of the surface of the source electrode 12 excluding the portion covered by the plated film 13 is covered by a first protective film 16. The first protective film 16 functions as a mask to prevent wetting spread of the plated film 13 when the plated film 13 is disposed. A second protective film 17 is disposed on the border between the plated film 13 and the first protective film 16 so as to cover the ends of the plated film 13 and the first protective film 16. The second protective film 17 functions as a mask to prevent wetting spread of the solder film 14 when the terminal pin 15 is bonded using solder. The second protective film 17 may cover the overall surface of the first protective film 16. By disposing the second protective film 17, exposure of the source electrode 12 is prevented even when a gap occurs between the plated film 13 and the first protective film 16.

The gate electrodes 9 of all the region cells constituting the main semiconductor switching element 10 are electrically connected to the gate pad (the electrode pad) in a portion not depicted. The configuration of the gate pad is same as that of the source electrode 12. Similar to the source electrode 12, each terminal pin 15 is bonded to the gate pad through the plated film 13 and the solder film 14. The diameter of each of and the number of the terminal pins 15 to be bonded to the gate pad may be determined based on the current capacity of the main semiconductor switching element 10. A back surface electrode (a second electrode) 18 is disposed on the entire surface of the back surface of the silicon carbide base body 100 (the back surface of the n⁺-type silicon carbide substrate 1). The back surface electrode 18 functions as the drain electrode of the main semiconductor switching element 10.

A circuit region to protect and control the main semiconductor switching element 10 will be described with reference to FIG. 1, taking as an example, an over voltage protection region 30, a current sensing region 40, a temperature sensing region 50, and a computing circuit region 60. The over voltage protection region 30 is a diode formed by a pn-junction 33 between a p-type anode region 31 and the n⁻-type silicon carbide layer 2 and protects the main semiconductor switching element 10 from, for example, over voltage (OV) such as a surge. FIG. 1 depicts the case where the over voltage protection regions 30 are disposed at two positions. The p-type anode region 31 is selectively disposed in the surface layer of the n⁻-type silicon carbide layer 2, on the side opposite the n⁺-type silicon carbide substrate 1 side (the base-body front surface side), and forms the pn-junction 33 with the n⁻-type silicon carbide layer 2.

An anode electrode 32 contacts the p-type anode region 31 through a contact hole not depicted. The anode electrode 32 is electrically connected to the source electrode 12 of the main semiconductor switching element 10. The configuration of the anode electrode 32 is same as that of the source electrode 12 of the main semiconductor switching element 10. The anode electrode 32 acts as the electrode pad of the over voltage protection region 30 (hereinafter, referred to as "OV pad"). Although not depicted, similar to the source electrode 12 of the main semiconductor switching element 10, each terminal pin 15 is bonded to the anode electrode 32 through the plated film 13 and the solder film 14 (see FIG. 2). The diameter of each of and the number of the terminal pins 15 to be bonded to the anode electrode 32 may be determined based on the current capacity of the over voltage protection region 30. The n⁺-type silicon carbide substrate 1 and the back surface electrode 18 respectively function as a cathode region and a cathode electrode of the over voltage protection region 30.

The current sensing region 40 has a function of detecting over current (OC) flowing through the main semiconductor switching element 10. The current sensing region 40 is a vertical MOSFET that includes about several region cells each having the same configuration as that of the main semiconductor switching element 10. The current sensing region 40 includes a MOS gate structure region including a first and a second p-type base regions 41 and 42, an n⁺-type source region 43, a p⁺-type contact region 44, an n-type JFET region 45, a gate insulating film 46, and a gate electrode 47, and a source electrode 48. The components constituting the MOS gate structure region of the current sensing region 40 each have the same configuration as that of the corresponding component of the MOS gate structure region of the main semiconductor switching element 10.

The configuration of the source electrode 48 is same as that of the source electrode 12 of the main semiconductor switching element 10. The source electrode 48 acts as the electrode pad of the current sensing region 40 (hereinafter, referred to as "OC pad"). Although not depicted, similar to the source electrode 12 of the main semiconductor switching element 10, each terminal pin 15 is bonded to the source electrode 48 through the plated film 13 and the solder film 14. The diameter of each of and the number of the terminal pins 15 to be bonded to the source electrode 48 may be determined based on the current capacity of the current sensing region 40. The source electrode 48 is electrically connected to the source electrode 12 of the main semiconductor switching element 10 through a sensing resistor 49.

The current sensing region 40 detects and branches a portion of a drain current flowing corresponding to turning on or off of the main semiconductor switching element 10 as a micro current through the sensing resistor 49. A portion 47a of the gate electrode 47 may be caused to protrude on the side of the interlayer insulating film not depicted by increasing the thickness of a portion of the gate insulating film 46. The gate electrodes 47 of all the region cells constituting the current sensing region 40 are electrically connected to the gate pad of the main semiconductor switching element 10. The back surface electrode 18 functions as the drain electrode of the current sensing region 40. The gate pad and the drain electrode of the current sensing region 40 are each commonly used with the gate pad and the drain electrode of the main semiconductor switching element 10.

The temperature sensing region 50 is a diode formed by a pn-junction between the p-type anode region 51 and the n-type cathode region 52, and has a function of detecting the temperature of the main semiconductor switching element 10 using the temperature property of the diode. The p-type anode region 51 is selectively disposed in the surface layer of the n⁻-type silicon carbide layer 2, on the side opposite the n⁺-type silicon carbide substrate 1 side. The n-type cathode region 52 is selectively disposed inside the p-type anode region 51 and forms a pn-junction 53 with the p-type anode region 51. The anode electrode 54 contacts the p-type anode region 51 through a contact hole not depicted. The cathode electrode 55 contacts the n-type cathode region 52 through a contact hole not depicted. The cathode electrode 55 is electrically connected to the source electrode 12 of the main semiconductor switching element 10.

The configuration of each of the anode electrode 54 and the cathode electrode 55 is same as that of the source electrode 12 of the main semiconductor switching element 10. The anode electrode 54 acts as the anode pad of the temperature sensing region 50. The cathode electrode 55 acts as the cathode pad of the temperature sensing region 50. Although not depicted, similar to the source electrode 12 of the main semiconductor switching element 10, the terminal pins 15 are bonded to the anode electrode 54 and the cathode electrode 55 through the plated film 13 and the solder film 14 (see FIG. 2). The diameter of each of and the number of the terminal pins 15 bonded to the anode electrode 54 and the cathode electrode 55 may be determined based on the current capacity of the temperature sensing region 50.

The temperature sensing region 50 may be a diode formed by a pn-junction between a p-type polysilicon (Poly-Si) layer and an n-type polysilicon layer deposited on the front surface of the silicon carbide base body 100. In this case, the p-type polysilicon layer and the n-type polysilicon layer constituting the temperature sensing region 50 may be formed using, for example, a portion of the polysilicon layer deposited on the front surface of the silicon carbide base body 100 when the gate electrode 9 of the main semiconductor switching element 10 is disposed. Forming the temperature sensing region 50 using the polysilicon layer prevents the temperature sensing region 50 from being adversely affected by the current flowing through the main semiconductor switching element 10.

The computing circuit region 60 controls the over voltage protection region 30, the current sensing region 40, and the temperature sensing region 50. The computing circuit region 60 controls the main semiconductor switching element 10 based on output signals of the over voltage protection region 30, the current sensing region 40, the temperature sensing region 50, and the like. The computing circuit region 60 protects the main semiconductor switching element 10 by, for example, limiting the current flowing through the main semiconductor switching element 10 by reducing the gate voltage applied to the main semiconductor switching element 10 when the temperature of the main semiconductor switching element 10 increases excessively. The computing circuit region 60 includes plural semiconductor switching elements such as, for example, complementary MOS (CMOS) circuits and FIG. 1 depicts an re-channel MOSFET constituting the CMOS circuit.

The n-channel MOSFET constituting the CMOS circuit of the computing circuit region 60 may be, for example, a vertical MOSFET having the same configuration as that of the main semiconductor switching element 10. The n-channel MOSFET constituting the CMOS circuit of the computing circuit region 60 includes a MOS gate structure region that includes a first and a second p-type base regions 61 and 62, an n$^+$-type source region 63, a p$^+$-type contact region 64, an n-type JFET region 65, a gate insulating film 66, and a gate electrode 67, and a source electrode 68. The components constituting the MOS gate structure region of the n-channel MOSFET constituting the CMOS circuit of the computing circuit region 60 each have the same configuration as that of the corresponding component of the MOS gate structure region of the main semiconductor switching element 10.

The source electrode 68 and the front surface electrode not depicted of each of other semiconductor switching elements constituting the computing circuit region 60 are electrically connected to the electrode pad of the computing circuit region 60 (hereinafter, referred to as "computing region pad" not depicted) in a portion not depicted. The configuration of the computing region pad is same as that of, for example, the source electrode 12 of the main semiconductor switching element 10. Although not depicted, similar to the source electrode 12 of the main semiconductor switching element 10, each terminal pin 15 is bonded to the computing region pad through the plated film 13 and the solder film 14. The diameter of each of and the number of the terminal pins 15 to be bonded to the computing region pad may be determined based on the current capacity of the computing circuit region 60.

Such electrode pads are disposed in a predetermined planar layout, away from each other by a predetermined interval on the front surface of the silicon carbide base body 100, as the source electrode 12 (hereinafter, referred to as "source pad 12"), the gate pad, the anode electrode 32 (hereinafter, referred to as "OV pad 32"), the source electrode 48 (hereinafter, referred to as "OC pad 48"), the anode electrode 54 (hereinafter, referred to as "anode pad 54"), the cathode electrode 55 (hereinafter, referred to as "cathode pad 55"), the computing region pad, and the like. Substantially the entire surface of the front surface of the silicon carbide base body 100 is covered with the plural plated films 13 that are each disposed away from each other by the predetermined interval. The electrode pads are electrically insulated from each other. The plated films 13 on the electrode pads are electrically insulated by the first protective film 16.

Figure 3:
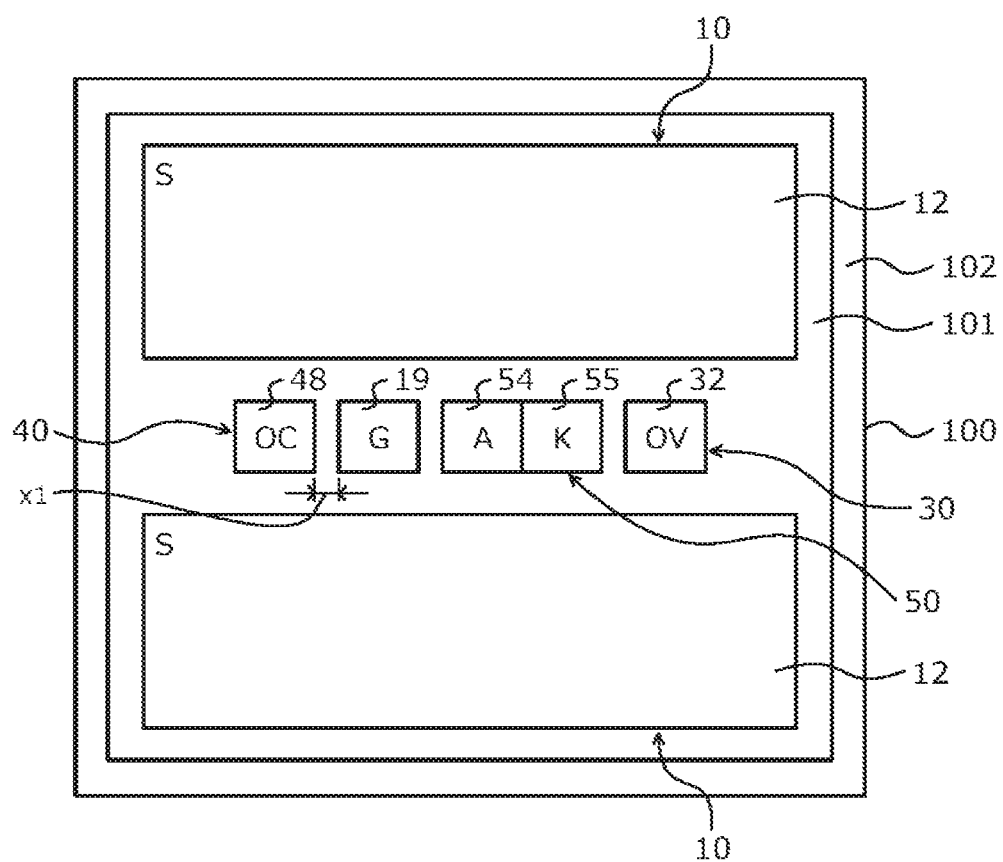
FIGS. 3, 4, and 5 are plan diagrams of an example of a planar layout of electrode pads of the semiconductor device according to the first embodiment.
Figure 4:
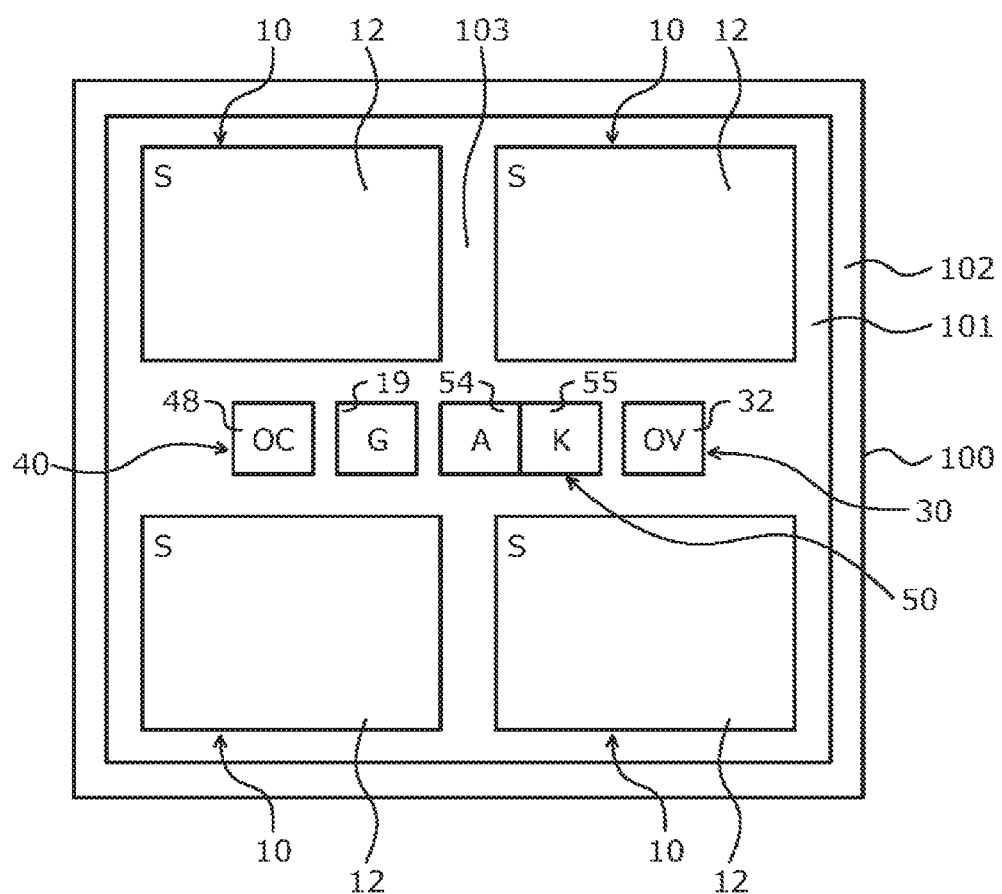
Figure 5:
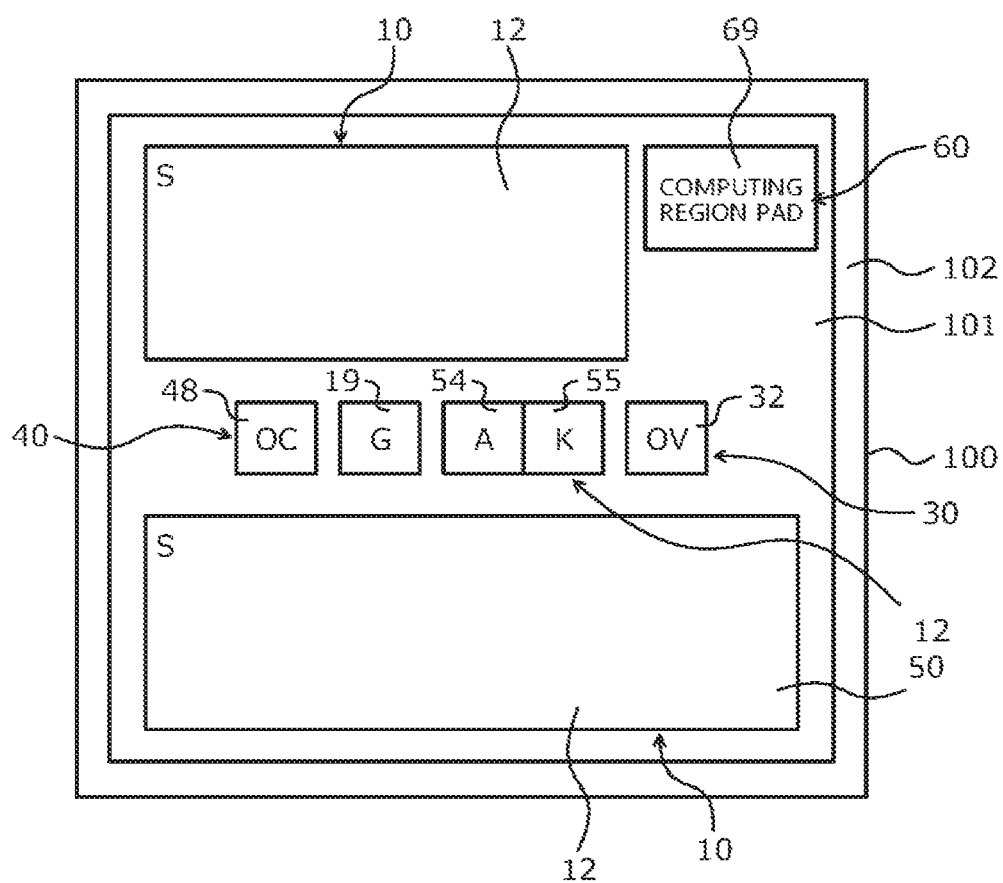

A planar layout of each of the electrode pads will be described. FIGS. 3, 4, and 5 are plan diagrams of an example of the planar layout of the electrode pads of the semiconductor device according to the first embodiment. FIGS. 3 and 4 each depict the planar layout of the source pad 12, the gate pad 19, the OV pad 32, the OC pad 48, the anode pad 54, and the cathode pad 55. In FIGS. 3 and 4, the source pad 12, the gate pad 19, the OV pad 32, the OC pad 48, the anode pad 54, and the cathode pad 55 are respectively represented by "S", "G", "OV", "OC", "A", and "K" (similarly in FIGS. 5 to 9). FIG. 5 depicts the planar layout of the source pad 12, the gate pad 19, the OV pad 32, the OC pad 48, the anode pad 54, the cathode pad 55, and a computing region pad 69. In FIG. 5, the computing region pad 69 is represented by "computing region" (similarly in FIG. 8).

The main semiconductor switching element 10 has a high current capacity compared to that of the other circuit regions. As depicted in FIGS. 3 and 4, the source pad 12 is therefore disposed on substantially the entire surface of the effective region (the region used as the active region 101) of the active region 101, excluding the area having the electrode pads other than the source pad 12 disposed therein. The planar layout of the source pad 12 may be changed variously corresponding to the required specification and is determined based on, for example, the current capacity of the main semiconductor switching element 10. For example, when the electrode pads other than the source pad 12 are disposed in one row in a straight line in a central portion of the active region 101, the two source pads 12 may be disposed to sandwich therebetween all the electrode pads other than the source pad 12 (FIG. 3).

The four source pads 12 each facing each other may be disposed at the vertexes of the semiconductor chip (the silicon carbide base body 100) in the planar shape that is a substantial rectangle, depending on the size of the chip (the silicon carbide base body 100) (FIG. 4). In this case, a gate runner not depicted may be disposed in the active region 101, at a portion 103 sandwiched by the source pads 12 that are disposed not sandwiching any other electrode pad and that are adjacent to each other. The gate electrodes 9 of all the region cells constituting the main semiconductor switching element 10 are electrically connected to the gate runner. For example, when the gate electrodes 9 of the main semiconductor switching element 10 are disposed in a stripe-like planar layout, the gate resistance may be high and differences in the operation timing among the region cells of the main semiconductor switching element 10 (an imbalanced operation) may occur whereas the operation timings of the region cells may be set to be substantially the same by disposing the gate runner.

The current sensing region 40 is operated under the same condition as that of the main semiconductor switching element 10 and includes, for example, some of the region cells of the main semiconductor switching element 10. The OC pad 48 is, therefore, disposed in the effective region in the active region 101. The electrode pads other than the source pad 12 and the OC pad 48 may be disposed in an ineffective region (the region not used as the active region 101) in the active region 101. The gate pad 19 may be disposed in an edge terminating region 102 (having a width of, for example, about 100 μm). The OV pad 32, the anode pad 54, and the anode pad 55 may be disposed together with the element structures of the over voltage protection region 30 and the temperature sensing region 50 in the edge terminating region 102. The anode pad 54 and the cathode pad 55 may be advantageously disposed in a vicinity of a region having a high current amount of the main semiconductor switching element 10 (for example, the central portion of the active region 101).

When electrode pads other than the source pad 12 are disposed parallel to each other, the order thereof in the disposition may be changed variously. For example, the anode pad 54 and the cathode pad 55 may have other electrode pads disposed therebetween. FIG. 3 depicts the anode pad 54 and the cathode pad 55 to be adjacent to each other though the anode pad 54 and the cathode pad 55 are in practice insulated from each other (similarly in FIGS. 4 to 9). A distance x1 between the adjacent electrode pads may be set to be narrow that is, for example, equal to or less than about 500 µm. The chip size is increased as the current capacity of the main semiconductor switching element 10 is increased. In a case where the chip size is set to be 5 mm$^2$, when the distance x1 between the adjacent electrode pads is set to be about 500 µm, the five electrode pads may be disposed in one row in a straight line. The surface area of the active region 101 becomes smaller as the chip size becomes smaller. The electrode pads may, therefore, be disposed in two rows.

The computing circuit region 60 includes the plural semiconductor switching elements such as the CMOS circuit as above. The computing circuit region 60 therefore includes the computing region pad 69 in addition to the front surface electrodes (such as the source electrode 68) of the plural semiconductor switching elements constituting the computing circuit region 60. When the computing circuit region 60 is disposed on the same silicon carbide base body 100 as the main semiconductor switching element 10, element structures of the plural semiconductor switching elements (including the front surface electrode) constituting the computing circuit region 60 may only be disposed in the effective region of the active region 101. The computing region pad 69 may be disposed in either an effective region or an ineffective region of the active region 101 (FIG. 5) or may be disposed in the edge terminating region 102. When the computing region pad 69 is disposed in the active region 101, the computing region pad 69 may be disposed as closely as possible to the edge terminating region 102. FIG. 5 depicts the state where the computing region pad 69 is added to the planar layout of the electrode pads depicted in FIG. 3 in a vicinity of a border between the active region 101 and the edge terminating region 102.

A method of manufacturing a semiconductor device according to the first embodiment will be described taking, as an example, a case where the main semiconductor switching element 10, for example, having a breakdown voltage of 1,200 V is manufactured. For example, the n$^+$-type silicon carbide substrate (a semiconductor wafer) 1 is prepared that is a silicon carbide single crystal having an n-type impurity (a dopant) doped therein such as nitrogen (N) such that the impurity concentration thereof is, for example, 2.0×10$^{19}$/cm$^3$. The front surface of the n$^+$-type silicon carbide substrate 1 may be a (000-1) surface that has an off-angle of, for example, about 4 degrees in a <11-20> direction. The n$^-$-type silicon carbide layer 2 having an n-type impurity such as nitrogen doped therein such that the impurity concentration thereof is, for example, 1.0×10$^{16}$/cm$^3$ is epitaxial-grown on the front surface of the n$^+$-type silicon carbide substrate 1 such that the thickness thereof is, for example, 10 µm.

The first p-type base region 3 of the main semiconductor switching element 10 is selectively formed in the surface layer of the n$^-$-type silicon carbide layer 2 using photolithography and ion implantation. In this case, p-type regions of the same configuration as that of the circuit region formed on the same silicon carbide base body 100 as the main semiconductor switching element 10 are formed together with the first p-type base region 3 of the main semiconductor switching element 10. The p-type regions of the circuit region formed on the same silicon carbide base body 100 as the main semiconductor switching element 10 are, for example, the p-type anode region 31 of the over voltage protection region 30, the first p-type base region 41 of the current sensing region 40, the p-type anode region 51 of the temperature sensing region 50, and the first p-type base region 61 of the computing circuit region 60. When the depth and the impurity concentration are different from those of the first p-type base region 3 (for example, the p-type anode region 31 of the over voltage protection region 30), a process including photolithography and ion implantation as one combination may be repeatedly executed further.

The p-type silicon carbide layer 4 having a p-type impurity such as aluminum doped therein such that the impurity concentration thereof is, for example, 2.0×10$^{16}$/cm$^3$ is epitaxial-grown on the surface of the n$^-$-type silicon carbide layer 2 such that the thickness thereof is, for example, 0.5 µm. At the process steps executed so far, the silicon carbide base body 100 is manufactured that is formed by sequentially stacking the n$^-$-type silicon carbide layer 2 and the p-type silicon carbide layer 4 on the front surface of the n*-type silicon carbide substrate 1. The n$^+$-type source region 5, the p$^+$-type contact region 6, and the n-type JFET region 7 are next formed by repeatedly executing the process including photolithography and ion implantation as a combination, under different ion implantation conditions. The sequence may be changed variously to form the n$^+$-type source region 5, the p$^+$-type contact region 6, and the n-type JFET region 7. In this case, together with these regions, the n$^+$-type regions, the p$^+$-type regions, and the n-type regions of and having the same configurations as that of the circuit region formed on the same silicon carbide base body 100 as the main semiconductor switching element 10 are formed.

The n$^+$-type regions of the circuit region formed on the same silicon carbide base body 100 as the main semiconductor switching element 10 are, for example, the n$^+$-type source region 43 of the current sensing region 40 and the n$^+$-type source region 63 of the computing circuit region 60. The p$^+$-type regions of the circuit region formed on the same silicon carbide base body 100 as the main semiconductor switching element 10 are, for example, the p$^+$-type contact region 44 of the current sensing region 40 and the p$^+$-type contact region 64 of the computing circuit region 60. The n-type regions of the circuit region formed on the same silicon carbide base body 100 as the main semiconductor switching element 10 are, for example, the n-type JFET region 45 of the current sensing region 40, the n-type cathode region 52 of the temperature sensing region 50, and the n-type JFET region 65 of the computing circuit region 60. The portions facing the first p-type base regions 41 and 61 in the depth direction of the p-type silicon carbide layer 4 respectively act as a second p-type base region 42 of the current sensing region 40 and a second p-type base region 62 of the computing circuit region 60.

Heat treatment (annealing) to activate the plural regions formed in the silicon carbide base body 100 using the ion implantation is executed, for example, at a temperature of about 1,620° C., for about 2 minutes. A gate insulating film that has a thickness of, for example, about 100 nm is formed by thermally oxidizing the front surface of the silicon carbide base body 100 by executing heat treatment at a temperature of about 1,000° C. in a mixed gas atmosphere of oxygen (O$_2$) gas and hydrogen (H$_2$) gas. The entire front surface of the silicon carbide base body 100 is covered with the insulating film. This insulating film acts as the gate insulating film 8 of the main semiconductor switching element 10, the gate insulating film 46 of the current sensing region 40, the gate insulating film 66 of the computing circuit region 60, and the like. A polysilicon layer having, for example, phosphorus (P) doped therein is formed on the insulating film. Patterning is executed for this polysilicon layer to selectively remove the polysilicon layer and the remaining polysilicon layer acts as the gate electrode 9 of the main semiconductor switching element 10, the gate electrode 47 of the current sensing region 40, and the gate electrode 67 of the computing circuit region 60.

The interlayer insulating film 11 including, for example, phosphorus silicate glass (PSG) is formed on the entire front surface of the silicon carbide base body 100 (formed) to have a thickness of, for example, 1.0 µm, to cover the gate electrodes 9, 47, and 67. Patterning is executed for the interlayer insulating film 11 and the gate insulating films 8, 46, and 66 using photolithography and etching to form contact holes of the main semiconductor switching element 10 and the circuit regions. The interlayer insulating film 11 is flattened by thermal treatment (reflowing). The titanium nitride film 21 is formed (deposited) to cover the interlayer insulating film 11 using, for example, a sputtering method. The titanium film 22 is formed along the surface of the titanium nitride film 21, the side walls of the contact holes, and the surface of the silicon carbide semiconductor region exposed in the contact hole using, for example, a sputtering method.

For example, a nickel (Ni) film to act as the back surface electrode 18 is formed on the back surface of the silicon carbide base body 100 (the back surface of the n+-type silicon carbide substrate 1) using, for example, a sputtering method. An ohmic junction of the titanium film 22 with the silicon carbide semiconductor region and an ohmic junction with the back surface electrode 18 and the silicon carbide base body 100 are formed by heat treatment at a temperature of, for example, 970° C. The titanium nitride film 23 is formed on the titanium film 22 using, for example, a sputtering method. The titanium film 24 is formed on the titanium nitride film 23 using, for example, a sputtering method. The metal film including aluminum or the like as a main material such as the aluminum film 25 is formed on the titanium film 24 using, for example, a sputtering method. The metal layered film to be the front surface electrode is formed by stacking the titanium nitride film 21, the titanium film 22, the titanium nitride film 23, the titanium film 24, and the aluminum film 25.

Patterning is executed for the metal layered film to be the front surface electrode using photolithography and etching. This patterning causes such portions of the metal layered film to remain in the predetermined planar layout, as those to be the source pad 12, the gate pad 19, the OV pad 32, the OC pad 48, the anode pad 54, the cathode pad 55, the front surface electrodes of the semiconductor switching elements constituting the computing circuit region 60, and the computing region pad 69. For example, the titanium film, the nickel film, and a gold (Au) film to be the back surface electrode 18 are sequentially formed on the surface of the nickel film formed as the back surface electrode 18. A portion excluding the area to form therein the plated film 13 of each of the electrode pads is covered with the first protective film 16. In this case, the first protective film 16 is embedded between the electrode pads to electrically insulate the electrode pads from each other. The electrode pads may electrically be insulated from each other by embedding another insulating film between the electrode pads before forming the first protective film 16.

The plated film 13 is formed on the surface of the electrode pads using the first protective film 16 as a mask. Substantially the entire front surface of the silicon carbide base body 100 is thereby selectively covered with the plated film 13. A border between the first protective film 16 and the plated film 13 is covered with the second protective film 17. The terminal pins 15 are bonded to the plated films 13 of the electrode pads using solder (the solder film 14). The silicon carbide base body 100 is thereafter cut (diced) into individual chips and the MOSFET depicted in FIGS. 1, 2, and 5 is thereby completed.

As described, according to the first embodiment, the semiconductor device may be produced (manufactured) by bonding the terminal pins to all the electrode pads disposed on the same single silicon carbide base body through the plated film and the solder film without using a bonding wire, which has low adhesion to the electrode pad under a high temperature condition. For example, high reliability may therefore be ensured even under a high temperature condition at, for example, about 200° C. to about 300° C. (about 150° C. for silicon (Si)), which is the operation temperature of a semiconductor device that uses a wide bandgap semiconductor such as, for example, silicon carbide. Because no bonding wire is used, adverse effects caused by cutting of the bonding wire or running the bonding wire around may be prevented and the reliability of the semiconductor device may be improved.

When bonding wires are used as in a conventional case, the electrode pads other than the source pad are disposed in the active region, near the border with the edge terminating region to facilitate the wire bonding. In contrast, according to the first embodiment, because the terminal pins are used, the voltage can be carried out from each of the electrode pads even when the electrode pads are disposed in a central portion of the semiconductor chip. The degree of freedom is high for the arrangement of the electrode pads (no restriction is imposed on the arrangement of the electrode pads). When bonding wires are used as in a conventional case, reductions in the size of the semiconductor device is limited because restrictions are imposed on the size (the surface area) of each of the electrode pads and the distance between the electrode pads (to exceed 500 µm) and reduction of the dimensions is therefore difficult. In contrast, according to the first embodiment, the size of each of the electrode pads may be reduced by reducing the diameter of each of the terminal pins, optimizing the process steps to dispose the plated films on the electrode pads, and the like. The chip size may therefore be reduced relative to the conventional chip size, enabling reduction of the size of the semiconductor device.

Figure 6:
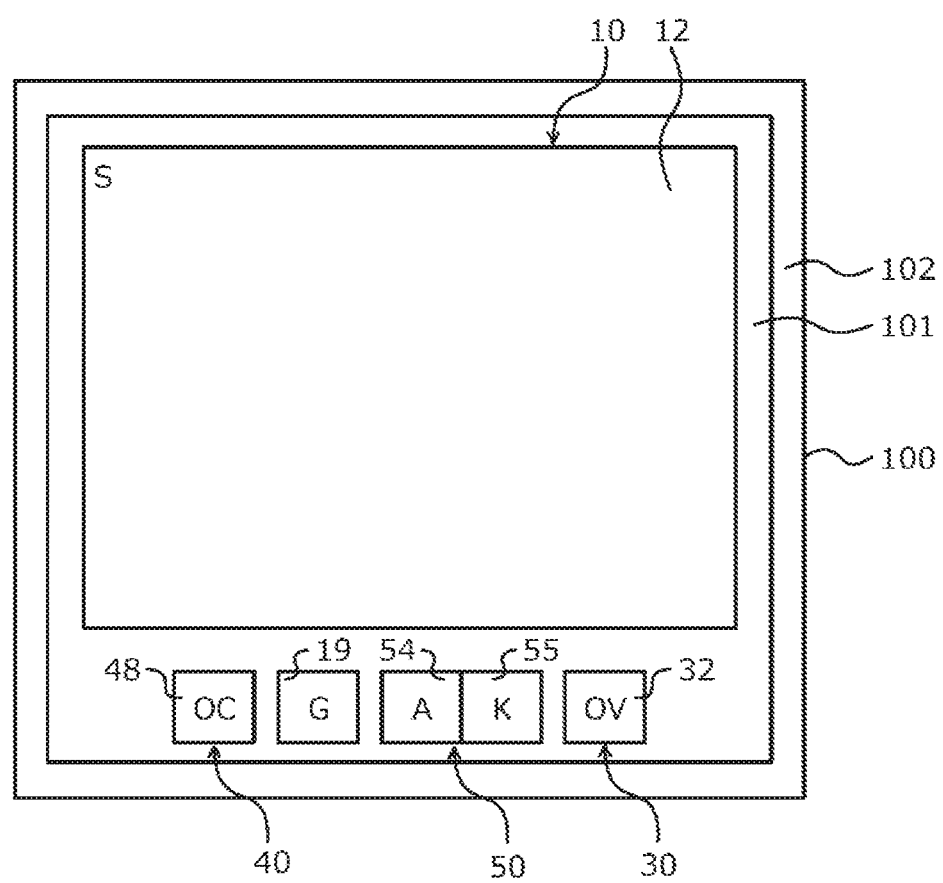
FIGS. 6, 7, 8, and 9 are plan diagrams of one example of a planar layout of the electrode pads of the semiconductor device according to a second embodiment.
Figure 7:
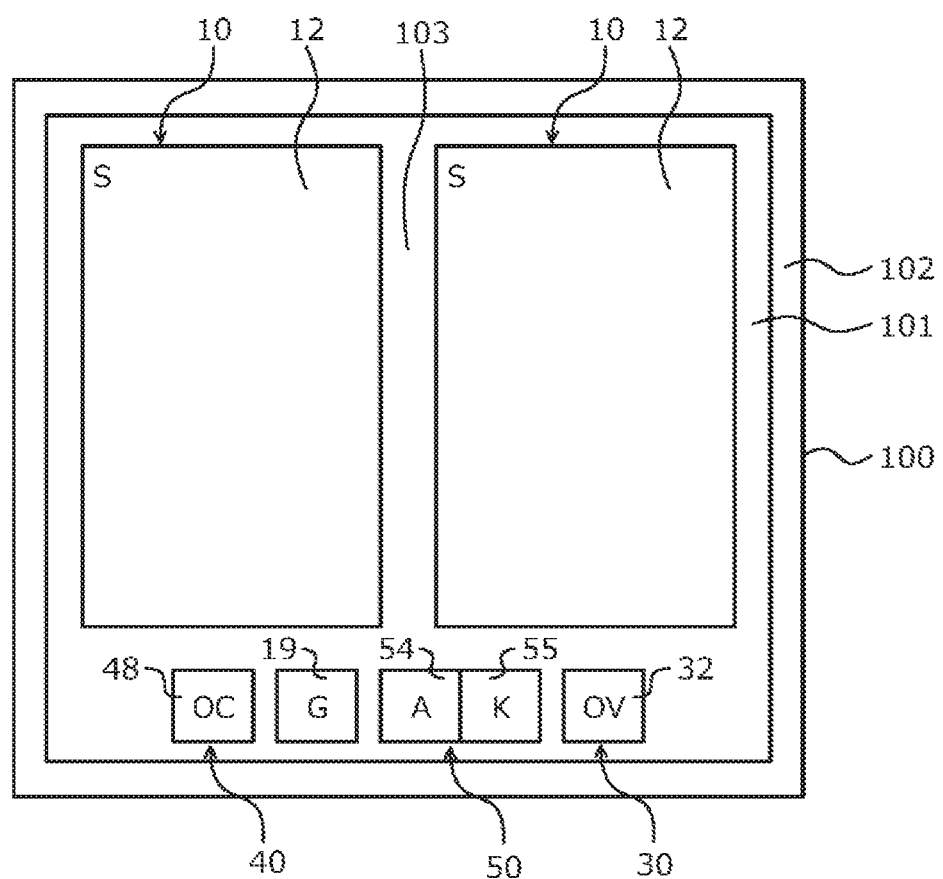
Figure 8:
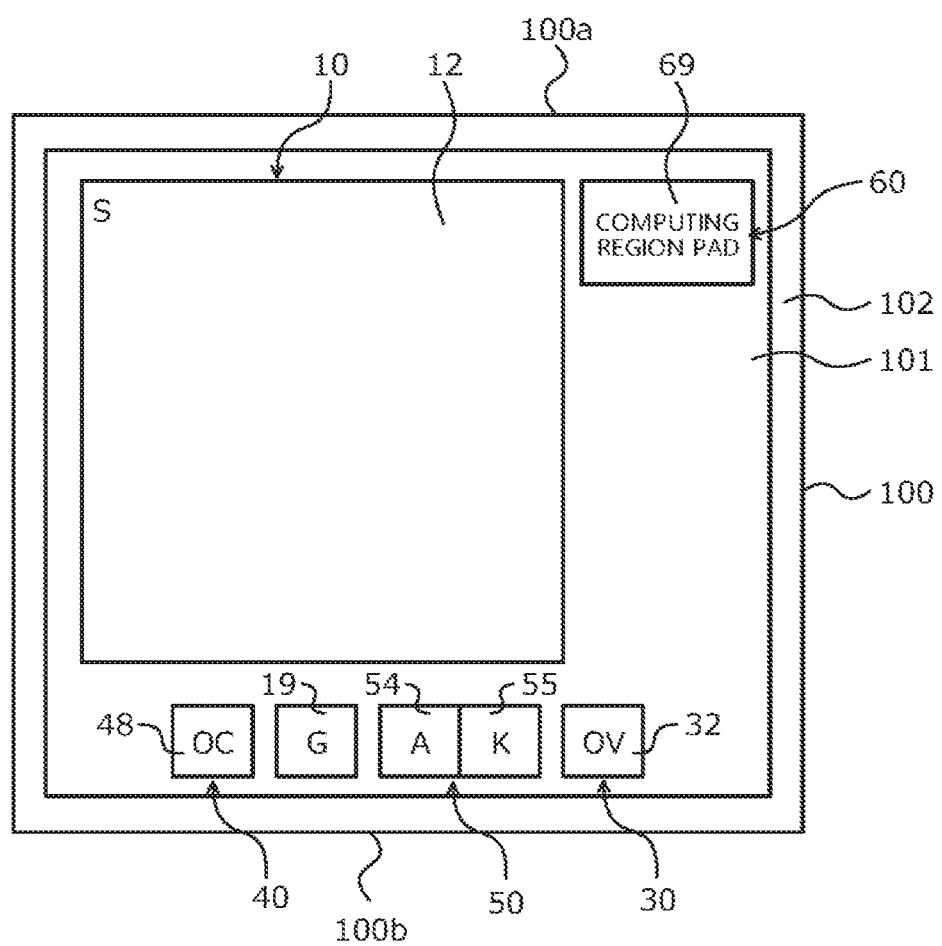
Figure 9:
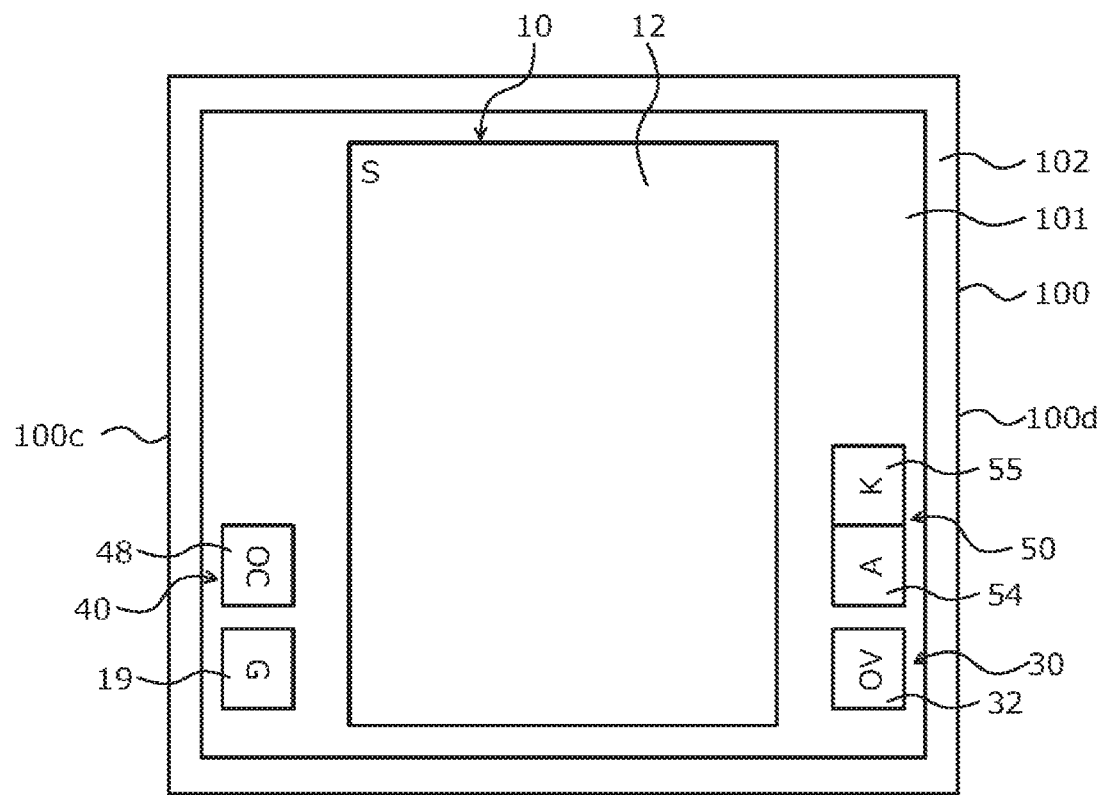

The structure of the semiconductor device according to the second embodiment will be described. FIGS. 6, 7, 8, and 9 are plan diagrams of one example of the planar layout of the electrode pads of the semiconductor device according to the second embodiment. The semiconductor device according to the second embodiment is different from the semiconductor device according to the first embodiment in the planar layout of the source pad 12, the gate pad 19, the OV pad 32, the OC pad 48, the anode pad 54, the cathode pad 55, and the computing region pad 69. FIGS. 6, 7, and 9 each depict a planar layout of the source pad 12, the gate pad 19, the OV pad 32, the OC pad 48, the anode pad 54, and the cathode pad 55. FIG. 8 depicts a planar layout of the source pad 12, the gate pad 19, the OV pad 32, the OC pad 48, the anode pad 54, the cathode pad 55, and the computing region pad 69.

As depicted in FIGS. 6 to 9, the electrode pads other than the source pad 12 may be disposed in the active region 101, near the border with the edge terminating region 102. In this case, the one source pad 12 may be disposed on substantially the entire surface of the effective region of the active region 101 (FIG. 6), in an area excluding the area having the electrode pads other than the source pad 12 disposed therein, or two source pads 12 may be disposed thereon (FIG. 7). The computing region pad 69 may be disposed as distantly as possible from the electrode pads other than the source pad 12 and as closely as possible to the edge terminating region 102. For example, the computing region pad 69, and the electrode pads other than the source pad 12 may be disposed closely to opposite sides (the sides having no vertex in common) 100a and 100b of the semiconductor chip (FIG. 8). FIG. 8 depicts a state where the computing region pad 69 is added to the planar layout of the electrode pads depicted in FIG. 6, in the active region 101, near the border with the edge terminating region 102.

As depicted in FIG. 9, the source pad 12 may be disposed at the center of the active region 101 and the electrode pads other than the source pad 12 may be divided into two groups to be disposed at two positions to sandwich the source pad 12 therebetween. For example, the gate pad 19 and the OC pad 48; and the OV pad 32, the anode pad 54, and the cathode pad 55 may respectively be disposed closely to opposite sides 100c and 100d of the semiconductor chip. The source pad 12 may be disposed between the gate pad 19 and the OC pad 48; and the OV pad 32, the anode pad 54, and the cathode pad 55. The types and the number of the electrode pads that are disposed for each of the opposite sides 100c and 100d of the semiconductor chip may be changed variously. Similar to the first embodiment, the electrode pads other than the source pad 12 and the OC pad 48 may be disposed further outwardly, that is, in the edge terminating region 102.

As described, according to the second embodiment, the same effect as that of the first embodiment may be achieved. In the conventional semiconductor device, the electrode pads other than the source pad are disposed in the active region, near the border with the edge terminating region. According to the second embodiment, size reduction is enabled without changing the arrangement of the circuit regions by applying the present invention to a conventional semiconductor device.

Figure 10:
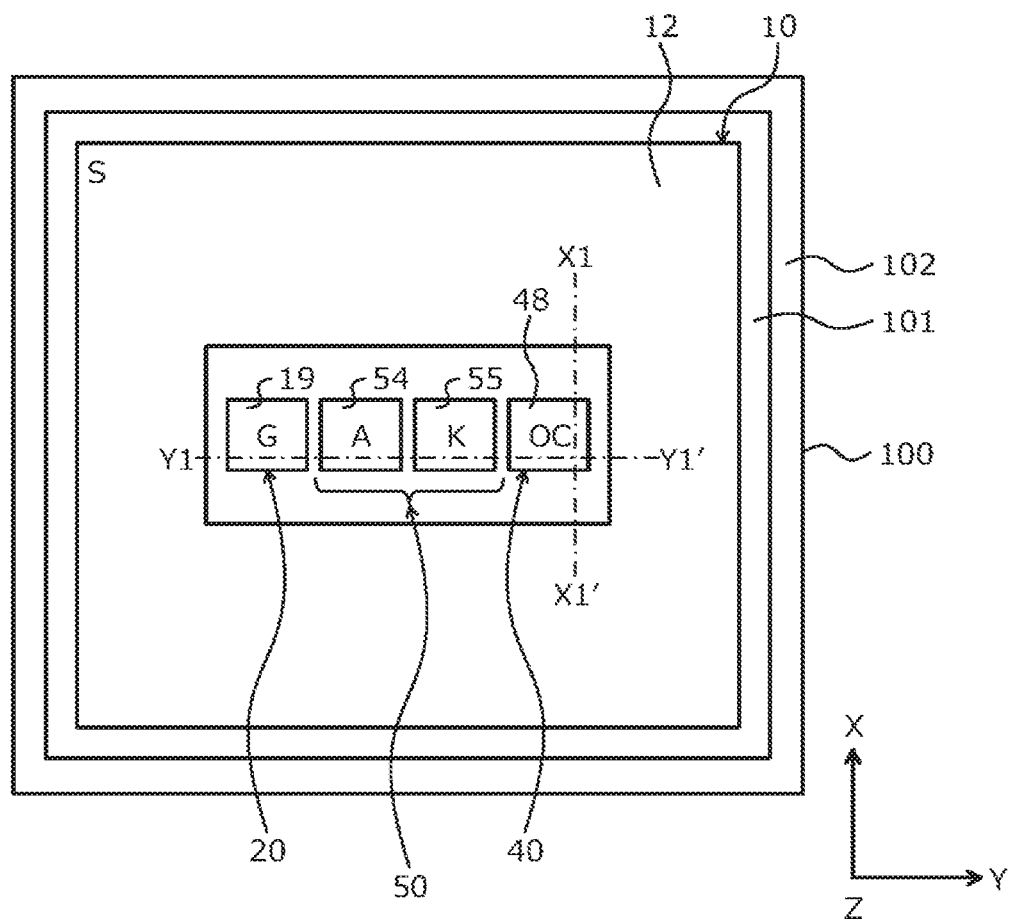
FIG. 10 is a planar diagram of one example of a planar layout of the semiconductor device according to a third embodiment.
Figure 11:
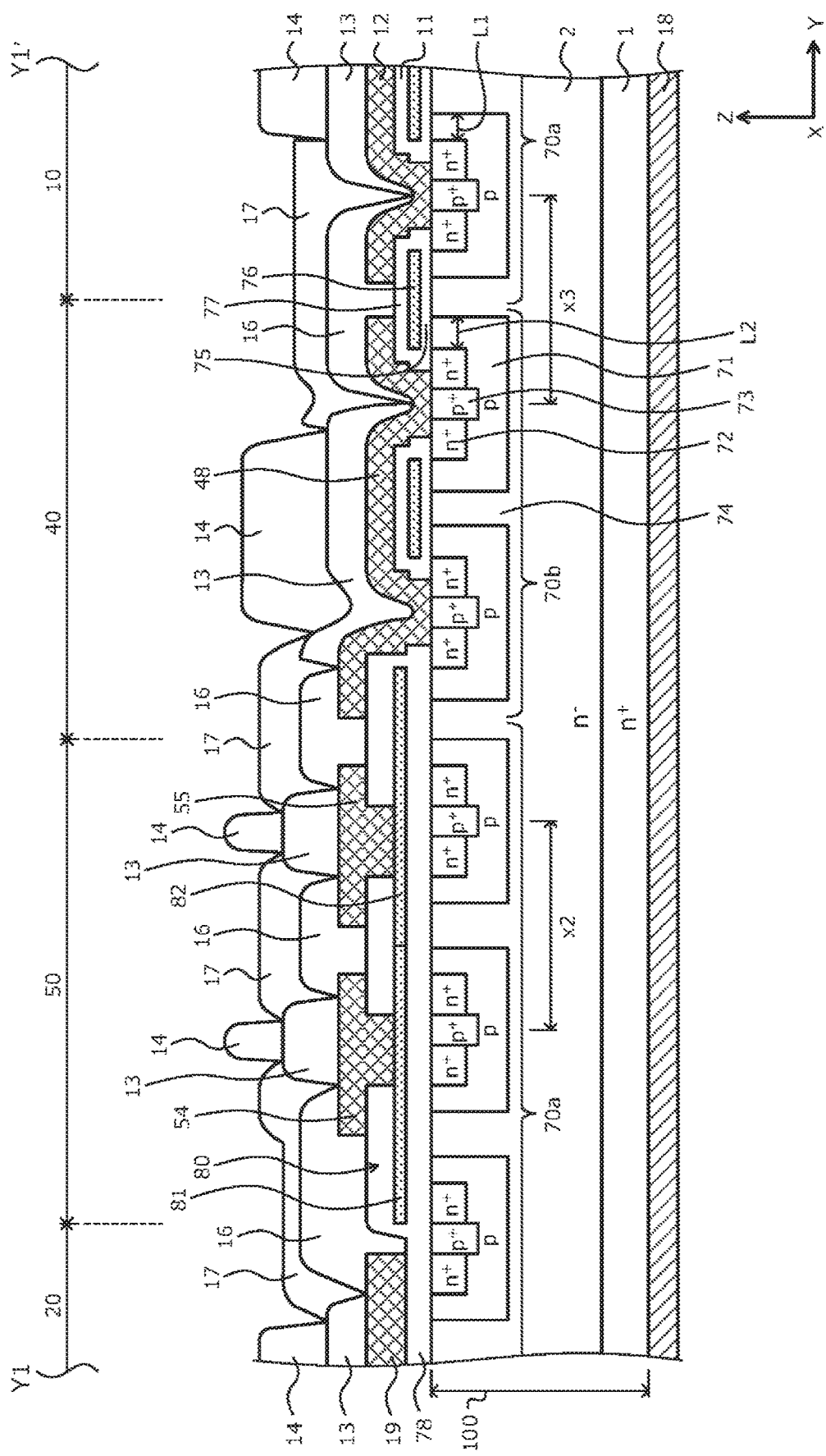
FIG. 11 is a cross-sectional view of a structure taken along a cutting line Y1 to Y1' of FIG. 10.
Figure 12:
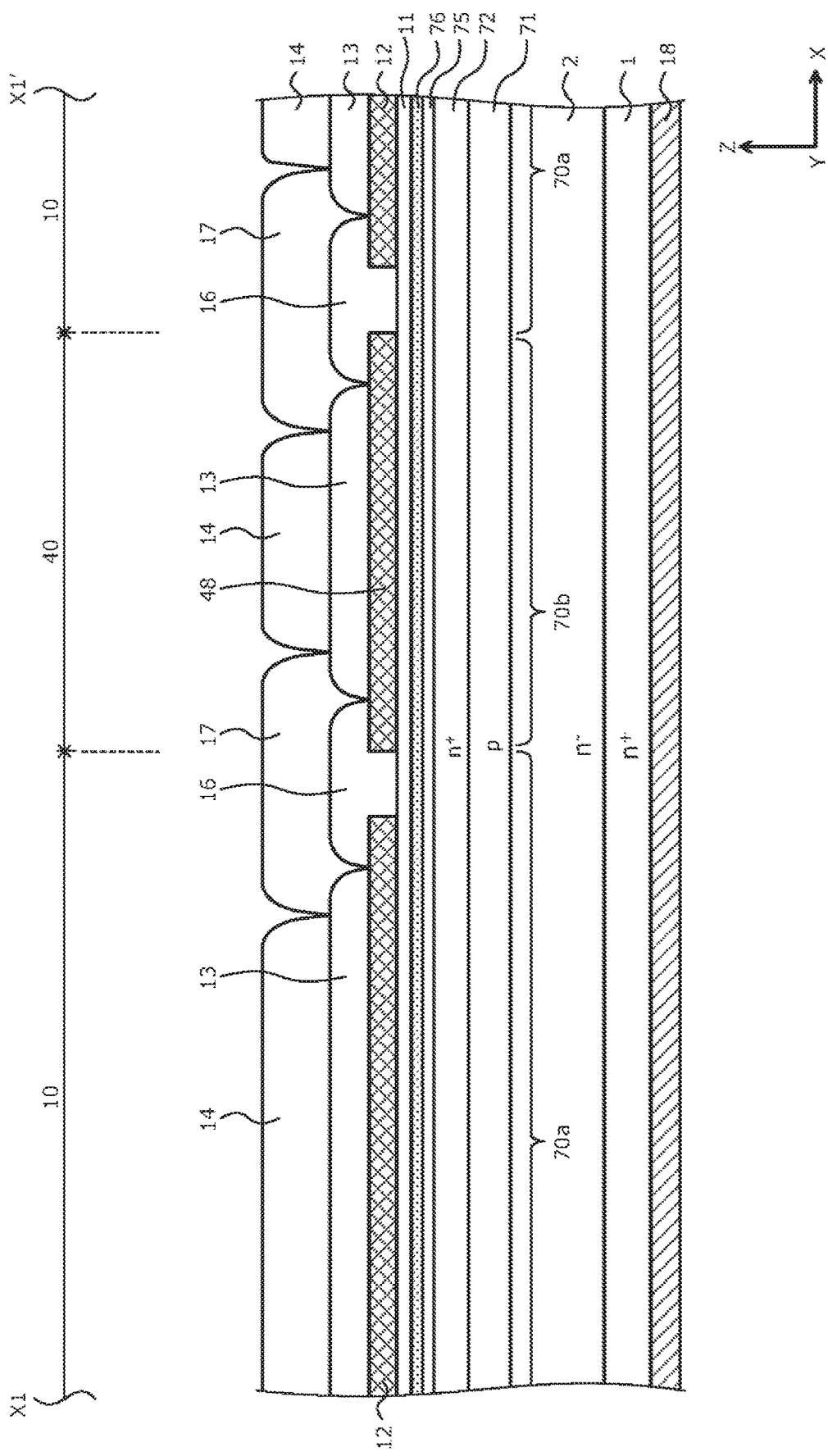
FIG. 12 is a cross-sectional view of the structure taken along a cutting line X1 to X1' of FIG. 10.
Figure 13:
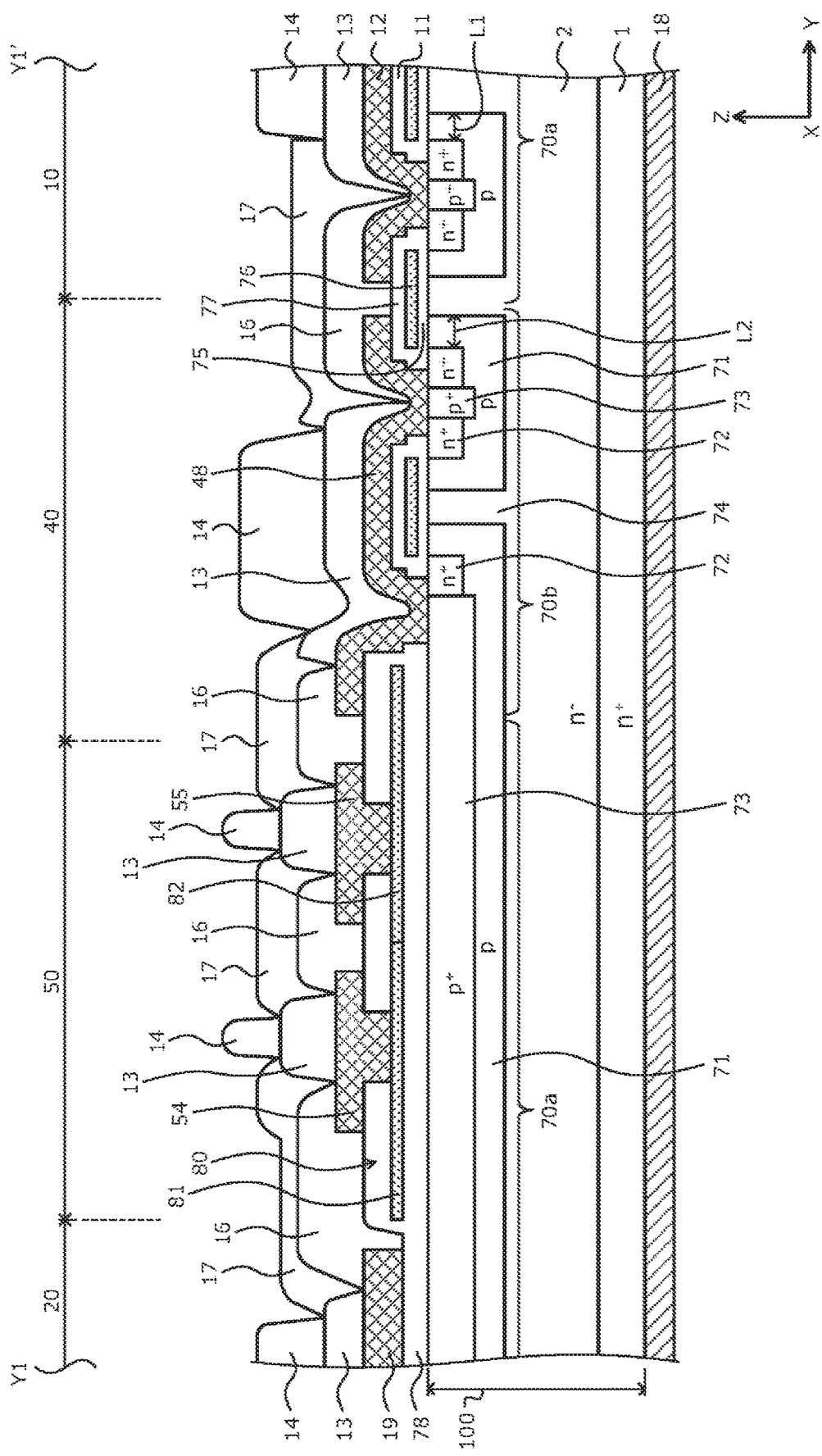
FIG. 13 is a cross-sectional view of another example of the structure taken along the cutting line Y1 to Y1' of FIG. 10.

In a third embodiment, one example of the arrangement of and the conditions for the MOS gate structure regions of the main semiconductor switching element 10 and the current sensing region 40 will be described. FIG. 10 is a planar diagram of one example of the planar layout of the semiconductor device according to the third embodiment. FIG. 11 is a cross-sectional view of the structure taken along a cutting line Y1 to Y1' of FIG. 10. FIG. 12 is a cross-sectional view of the structure taken along a cutting line X1 to X1' of FIG. 10. FIG. 13 is a cross-sectional view of another example of the structure taken along the cutting line Y1 to Y1' of FIG. 10. Although FIGS. 10 to 13 depict a case where, for example, the current sensing region 40, the temperature sensing region 50, and a gate pad region 20 are disposed on the same silicon carbide base body 100 the main semiconductor switching element 10, the first over voltage protection region and the computing circuit region may be disposed thereon similar to the first embodiment.

As depicted in FIG. 10, the source pad (the source electrode) 12, the gate pad 19, the OC pad (the source electrode) 48, the anode pad (the anode electrode) 54, and the cathode pad (the cathode electrode) 55 are disposed in a predetermined planar layout in the active region 101 on the front surface of the silicon carbide base body 100. The planar layout of the source pad 12 may be changed variously corresponding to required specifications. For example, the source pad 12 may be disposed in a planar layout having a substantially rectangular frame shape surrounding all the electrode pads other than the source pad 12, and the electrode pads other than the source pad 12 may be disposed in one row in a straight line in a central portion of the active region 101. The planar layout of the electrode pads may be same as that of each of the first and the second embodiments (see FIGS. 3 to 9).

As depicted in FIG. 11, the semiconductor regions constituting each MOS gate structure region of the main semiconductor switching element 10 are disposed at predetermined pitches x2 throughout the entire active region 101 regardless of the planar layout of the electrode pads disposed in the active region 101. A MOS gate structure region 70b of the current sensing region 40 includes a portion of the MOS gate structure region disposed as the main semiconductor switching element 10 on the silicon carbide base body 100. For the MOS gate structure region 70b of the current sensing region 40, the pitch x3 with a MOS gate structure region 70a of the main semiconductor switching element 10, that is adjacent thereto in a second direction Y described later may be set to be equal to the pitch x2 between the MOS gate structure regions 70a of the main semiconductor switching element 10 (x2=x3).

For example, the MOS gate structure region 70a of the main semiconductor switching element 10 includes a p-type base region 71, an n$^+$-type source region 72, a p$^+$-type contact region 73, an n-type JFET region 74, a gate insulating film 75, and a gate electrode 76. The p-type base region 71 is selectively disposed in the surface layer on the front surface side of the silicon carbide base body 100. The p-type base region 71 may include the first and the second p-type base regions similar to the first embodiment. The n$^+$-type source region 72 and the p$^+$-type contact region 73 are each selectively disposed inside the p-type base region 71. The n-type JFET region 74 is disposed between the adjacent p-type base regions 71.

The p-type base region 71, the n$^+$-type source region 72, the p$^+$-type contact region 73, and the n-type JFET region 74 are disposed not only immediately beneath the source pad 12 (the portion facing in the depth direction) but also in a portion excluding the portion immediately beneath the source pad 12 throughout the entire active region 101. The entire active region 101 acts as the effective region. The p-type base region 71, the n$^+$-type source region 72, and the p$^+$-type contact region 73 may be disposed in, for example, a striped-like planar layout extending along a direction parallel to the front surface of the base body for a contact (the electric contact) with the source pad 12 as described later. The p-type base regions 71 may be disposed at, for example, equal intervals of the predetermined pitch x2 throughout the entire active region 101.

The n$^+$-type source region 72, the p$^+$-type contact region 73, and the n-type JFET region 74 are disposed in a stripes-like planar layout extending in a direction (hereinafter, referred to as "first direction") X that is same as that of the stripes-like p-type base region 71. The n$^+$-type source region 72 and the p$^+$-type contact region 73 contact the source pad 12 at the portion immediately beneath the source pad 12. A portion immediately beneath the gate pad 19, the anode pad 54, and the cathode pad 55 of the n$^+$-type source region 72 and the p$^+$-type contact region 73 contacts the source pad 12 at a portion not depicted. A portion immediately beneath the OC pad 48 (the portion facing the side of the drain in the depth direction) of the MOS gate structure region disposed as the main semiconductor switching element 10 on the silicon carbide base body 100 is used as the MOS gate structure region 70b of the current sensing region 40 and a portion excluding the above acts as the MOS gate structure region 70a of the main semiconductor switching element 10.

For example, a portion of at least one stripe of the striped-like p-type base region 71 acts as the p-type base region 71 that constitutes the MOS gate structure region 70b of the current sensing region 40. The MOS gate structure region 70a of the main semiconductor switching element 10 and the MOS gate structure region 70b of the current sensing region 40 are therefore continuously disposed in the first direction X (FIG. 12). The n$^+$-type source region 72 and the p$^+$-type contact region 73 contact the OC pad 48 at the portion immediately beneath the OC pad 48. The OC pad 48 has a size of about one of several thousandths of the source pad 12 (for example, equal to or larger than about 20 μm square and equal to about 50 μm square). The OC pad 48 may be disposed to have a width facing, in the depth direction, the plural striped-like p-type base regions 71 (a width in the direction Y perpendicular to the first direction X (hereinafter, referred to as "second direction") (FIG. 11).

The gate electrode 76 is disposed through the gate insulating film 75 on the surface of the p-type base region 71 immediately beneath the source pad 12 and the OC pad 48, at a portion sandwiched by the n$^+$-type source region 72 and the n-type JFET region 74. The gate electrode 76 is electrically insulated from the source pad 12 and the OC pad 48 by the interlayer insulating film 77. The gate electrode 76 is not disposed in the temperature sensing region 50 and the gate pad region 20. The gate pad 19, the anode pad 54, the cathode pad 55, and a diode 80 described later of the temperature sensing region 50 are electrically insulated from the silicon carbide base body 100 by the interlayer insulating film 77 and the oxide film 78 on the front surface of the silicon carbide base body 100.

The temperature sensing region 50 is the diode 80 formed by a pn-junction between the p-type polysilicon layer 81 and the n-type polysilicon layer 82. The p-type polysilicon layer 81 and the n-type polysilicon layer 82 are disposed on the oxide film 78, and respectively contact the anode pad 54 and the cathode pad 55. In a portion not depicted, the gate pad 19 is electrically connected to all the gate electrodes 76 of the MOS gate structure regions 70a and 70b. Similar to the first embodiment, the terminal pins not depicted are bonded to each of the electrode pads through the plated film 13 and the solder film 14. Similar to the first embodiment, the electrode pads are electrically insulated from each other by the first and the second protective films 16 and 17.

The p-type base region 71 constituting the MOS gate structure region 70a of the main semiconductor switching element 10 corresponds to the first and the second p-type base regions 3 and 4a of the main semiconductor switching element 10 of the first embodiment (see FIGS. 1 and 2) and the components other than the p-type base region 71 (denoted by the reference numerals 72 to 76) respectively correspond to the corresponding components of the main semiconductor switching element 10 of the first embodiment (denoted by the reference numerals 5 to 9). The p-type base region 71 constituting the MOS gate structure region 70b of the current sensing region 40 corresponds to the first and the second p-type base regions 41 and 42 of the current sensing region 40 of the first embodiment, and the components other than the p-type base region 71 respectively correspond to the corresponding components of the current sensing region 40 of the first embodiment (denoted by the reference numerals 43 to 47).

The entire active region 101 can be used as the effective region by disposing the semiconductor regions constituting the MOS gate structure regions 70a and 70b as described. The ineffective region (for example, a width of 600 μm to a width of 300 μm) generally disposed to isolate the main semiconductor switching element 10 and the current sensing region 40 from each other is omitted by configuring the MOS gate structure region 70b of the current sensing region 40 by the portion of the MOS gate structure region 70a of the main semiconductor switching element 10. As a result, size reductions of the semiconductor chip may be facilitated and the yield of the semiconductor chips cut from one semiconductor wafer is improved. This embodiment is therefore especially useful when a silicon carbide wafer having many crystal faults present therein is used.

Because the ineffective region separating the main semiconductor switching element 10 and the current sensing region 40 from each other is omitted, the MOS gate structure region 70a of the main semiconductor switching element 10 and the MOS gate structure region 70b of the current sensing region 40 may be disposed without changing the pitch thereof. Thus, reduction of the drift current flowing in the current sensing region 40 may be suppressed and the precision of the over current detection by the current sensing region 40 is therefore improved. Because the ineffective region separating the main semiconductor switching element 10 and the current sensing region 40 from each other is omitted, property degradation caused by the ineffective region (for example, an increase of the ON-resistance RonA) can be prevented.

As to the silicon carbide semiconductor device, the wiring structure using bonding wires is more difficult to be employed as the chip size becomes larger (for example, to be equal to or larger than 8 mm$^2$) and a wiring structure using terminal pins is employed. A conventional wiring structure using terminal pins includes many ineffective regions that each separates the main semiconductor switching element and the current sensing region from each other. The third embodiment is therefore especially useful when the chip size is large. The main semiconductor switching element 10 and the current sensing region 40 are both MOSFETs and tend to be resistant to damage even when current imbalance occurs. No problem therefore arises concerning characteristics even when an ineffective region separating the main semiconductor switching element 10 and the current sensing region 40 from each other is not provided.

In the present invention, because the terminal pin is bonded to the electrode pad using solder, the MOS gate structure region 70b of the current sensing region 40 may be configured to have design values different from those of the MOS gate structure region 70a of the main semiconductor switching element 10. The reason for this is as follows. The current sensing region 40 is designed to have the same design values as those of the main semiconductor switching element 10 to have the same characteristics as that of the main semiconductor switching element 10. Stress exceeding the stress applied to the source pad 12 is however applied to the OC pad 48 when the terminal pin is bonded thereto using solder because the diameter of the terminal pin (not depicted) (denoted by the reference numeral "15" of FIG. 2) soldered to the OC pad 48 is small compared to the diameter of the terminal pin (not depicted) that is soldered to the source pad 12.

The inventors confirmed that the stress applied during the soldering of the terminal pin caused the gate threshold voltage of the current sensing region 40 to have a value different from that of the gate threshold voltage of the main semiconductor switching element 10. In this case, the main semiconductor switching element 10 and the current sensing region 40 do not operate at predetermined current ratios and a large current tends to flow through the current sensing region 40. The breakdown voltage of the current sensing region 40 thereby becomes lower than the breakdown voltage of the main semiconductor switching element 10, and the voltage gain (the voltage amplification rate) of the current sensing region 40 therefore needs to be set to be equal to the voltage gain of the main semiconductor switching element 10. The initial design values of the current sensing region 40 are changed such that, for example, the gate threshold voltage of the current sensing region 40 is as close as possible to the gate threshold voltage of the main semiconductor switching element 10.

For example, a channel length L2 to be one of the variables to vary the gate threshold voltage of the current sensing region 40 may be changed to a design value different from the initial design value (that is, a channel length L1 of the main semiconductor switching element 10). A method of changing the design value of the channel length L2 of the current sensing region 40 is as follows. The difference in the gate threshold voltage between the main semiconductor switching element 10 and the current sensing region 40 is first obtained from a semiconductor device manufactured or simulated in advance based on the initial design values. The channel length L2 of the current sensing region 40 is recalculated based on the difference in the gate threshold voltage between the main semiconductor switching element 10 and the current sensing region 40. The semiconductor device to finally be a product may be manufactured using the new design values based on the recalculated value.

In the recalculation of the channel length L2 of the current sensing region 40, the calculation may be executed such that the gate threshold voltage of the current sensing region 40, varied by the stress applied to the OC pad 48 when the terminal pin is soldered is set to be close to the gate threshold voltage of the main semiconductor switching element 10. The difference in the gate threshold voltage between the main semiconductor switching element 10 and the current sensing region 40 generated by the stress applied when the terminal pin is soldered is usually about 1 V and is reproducible. A semiconductor device that has the gate threshold voltage of the current sensing region 40 set to be close to the gate threshold voltage of the main semiconductor switching element 10 with a predetermined acceptable error may be easily manufactured, by manufacturing a semiconductor device to finally be a product using the new design values based on the recalculated channel length L2 of the current sensing region 40.

As described, the breakdown voltage of the current sensing region 40 may be improved by recalculating and setting the channel length L2 of the current sensing region 40 based on the difference in the gate threshold voltage between the main semiconductor switching element 10 and the current sensing region 40. The acceptable error of the difference in the gate threshold voltage between the main semiconductor switching element 10 and the current sensing region 40 is, for example, about ±0.5 V. It is assumed that the breakdown voltage of the current sensing region 40 is equal to or higher than the breakdown voltage of the main semiconductor switching element 10 even in a case where the gate threshold voltage of the current sensing region 40 is varied by the stress applied to the OC pad 48 when the terminal pin is soldered. In this case, a semiconductor device to finally be a product may be manufactured without recalculating the channel length L2 of the current sensing region 40 and using the initial design value therefor.

As depicted in FIG. 13, the portions immediately beneath the gate pad 19, the anode pad 54, and the cathode pad 55 may be used as the ineffective regions without disposing therein the semiconductor regions constituting the MOS gate structure region 70a. In this case, the MOS gate structure region may be disposed in a striped-like planar layout extending along the first direction X or may be disposed in a matrix-like planar layout. When the MOS gate structure region is disposed in the striped-like planar layout, the p-type base region 71, the $n^+$-type source region 72, the $p^+$-type contact region 73, and the n-type JFET region 74 are disposed in the effective region of the active region 101 in the striped-like planar layout extending along the first direction X.

When the MOS gate structure region is disposed in the matrix-like planar layout, the p-type base region 71 is disposed in the effective region of the active region 101 in the matrix-like planar layout. The $p^+$-type contact region 73 is disposed near a central portion of the p-type base region 71 and the $n^+$-type source region 72 is disposed surrounding the periphery of the $p^+$-type contact region 73, in a planar layout. The n-type JFET region 74 is disposed in a grid-like planar layout passing between the adjacent p-type base regions 71. The p-type base regions 71 and the $p^+$-type contact regions 73 constituting the adjacent main semiconductor switching element 10 or the current sensing regions 40 may extend in the portions immediately beneath the gate pad 19, the anode pad 54, and the cathode pad 55.

In the third embodiment, a portion of the MOS gate structure region disposed as the main semiconductor switching element 10 on the silicon carbide base body 100 is used as the MOS gate structure region 70b of the current sensing region 40. The channel length L2 of the current sensing region 40 is in addition set such that the voltage gains of the main semiconductor switching element 10 and the current sensing region 40 are as close as possible to each other. When these conditions are satisfied, for example, the MOS gate structure region 70a of the main semiconductor switching element 10 and the MOS gate structure region 70b of the current sensing region 40 may each be disposed each in a planar layout different from each other.

As described, according to the third embodiment, the same effect as that of the first and the second embodiments may be achieved. According to the third embodiment, downsizing of the semiconductor chip, improvement of the yield of the semiconductor chips cut from one semiconductor wafer, improvement of the current capacity of the main semiconductor switching element, and the like may be facilitated by disposing the semiconductor regions constituting the MOS gate structure region over the entire active region and configuring the current sensing region using the portion thereof. According to the third embodiment, the breakdown voltage of the current sensing region may be prevented from becoming lower than the breakdown voltage of the main semiconductor switching element by setting the channel length of the current sensing region such that the gate threshold voltage of the current sensing region is close to the gate threshold voltage of the main semiconductor switching element.

Figure 14:
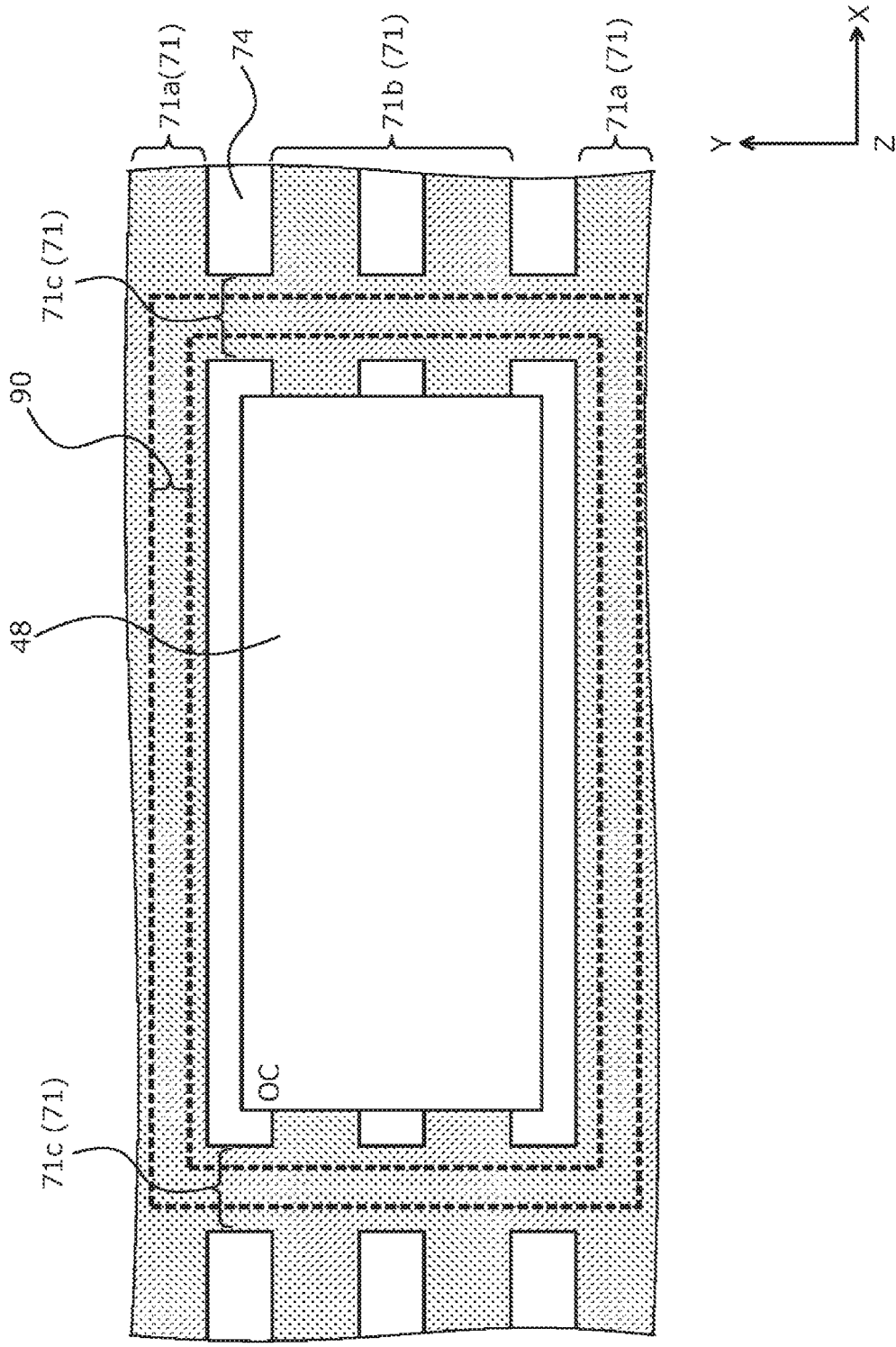
FIG. 14 is a plan diagram of a planar layout of components of the semiconductor device according to a fourth embodiment.
Figure 15:
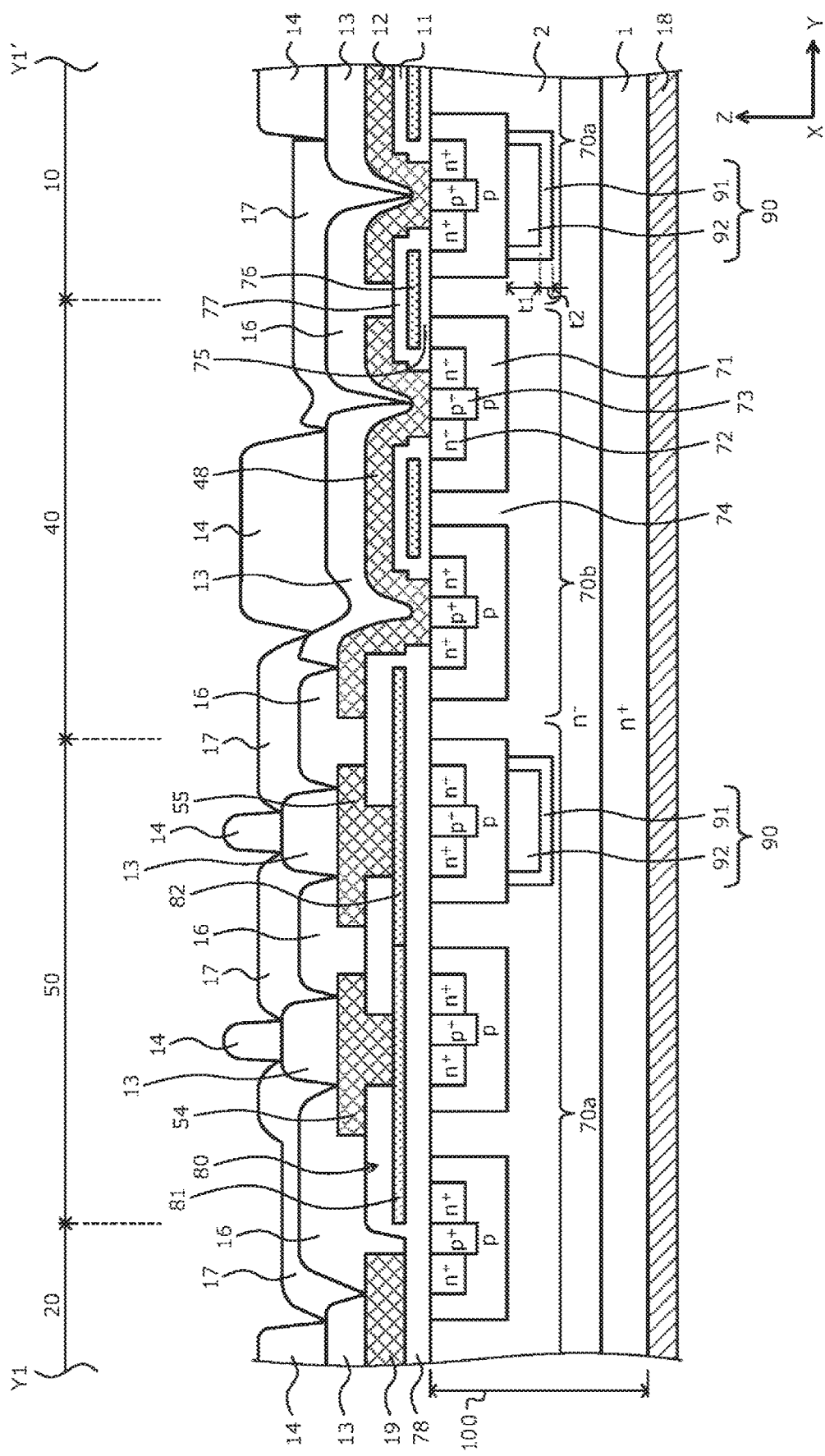
FIGS. 15 and 16 are cross-sectional views of one example of the structure of the semiconductor device according to the fourth embodiment.
Figure 16:
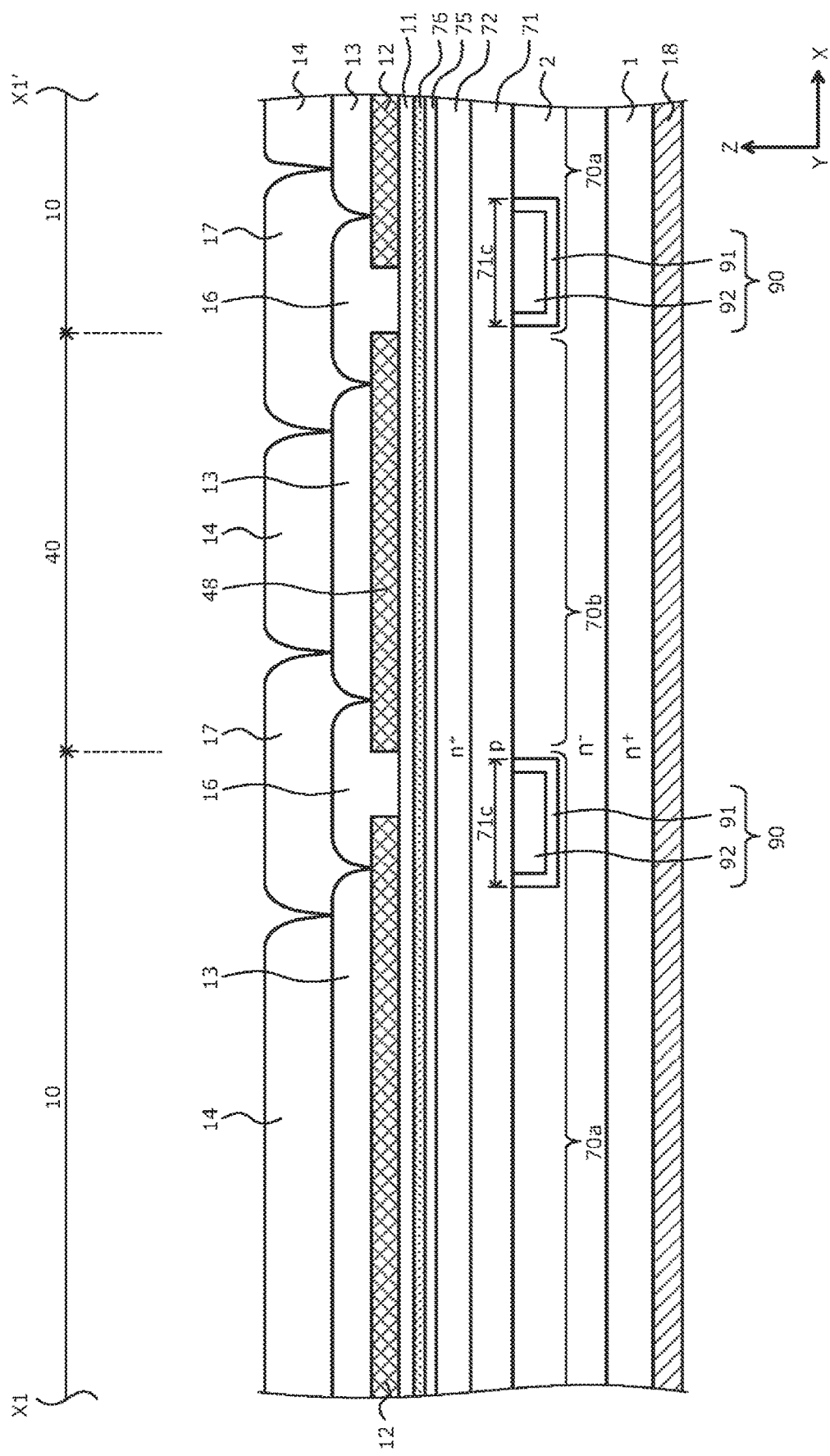

The structure of a semiconductor device according to a fourth embodiment will be described. FIG. 14 is a plan diagram of a planar layout of components of the semiconductor device according to the fourth embodiment. FIGS. 15 and 16 are cross-sectional views of one example of the structure of the semiconductor device according to the fourth embodiment. The planar layout of the semiconductor device according to the fourth embodiment is assumed to be same as that of the third embodiment (see FIG. 10) while the first over voltage protection region and the computing circuit region may be disposed similarly to the first embodiment. FIG. 14 depicts a planar layout of the vicinity of the OC pad 48 of FIG. 10. FIG. 15 depicts a cross-sectional view along the cutting line Y1 to Y1' of FIG. 10. FIG. 16 depicts a cross-sectional view along the cutting line X1 to X1' of FIG. 10.

The semiconductor device according to the fourth embodiment is different from the semiconductor device according to the third embodiment in that a second over voltage protection region 90 to protect the current sensing region 40 from over voltage is included in a portion of the main semiconductor switching element 10.

For example, as depicted in FIG. 14, the second over voltage protection region 90 is disposed in, for example, a substantially rectangular frame shape surrounding the periphery of the current sensing region 40. In FIG. 14, the second over voltage protection region 90 is a portion surrounded by two thick dotted line frames. For example, it is assumed that the p-type base region 71 is disposed in a striped-like planar layout. The p-type base region 71a on the side closest to the current sensing region 40 along the second direction Y and the p-type base region 71b disposed between the p-type base regions 71a are connected to each other by a p-type region (hereinafter, referred to as "p-type base connection region") 71c parallel to the second direction Y. The p-type connection region 71c has, for example, the same depth and the same impurity concentration as those of the p-type base region 71 and functions as the p-type base region 71.

The p-type base connection region 71c connects portions of the p-type base region 71, forming the MOS gate structure region 70a of the main semiconductor switching element 10 and does not face the OC pad 48 in the depth direction Z. The two p-type base connection regions 71c are disposed to sandwich the current sensing region 40. The current sensing region 40 is disposed in a rectangular frame formed by the p-type base region 71a on the side closest to the current sensing region 40 along the second direction Y and the p-type base connection region 71c. The second over voltage protection region 90 is disposed in a substantially rectangular frame shape planar layout along the p-type base region 71a on the side closest to the current sensing region 40 along the second direction Y and the p-type base connection region 71c, and faces the p-type base region 71a and the p-type base connection region 71c in the depth direction. FIG. 14 does not depict the constituent regions other than the p-type base region 71 and the n-type JFET region of the MOS gate structure region.

Although not depicted, the second over voltage protection region 90 may be disposed in a substantially concentric circle shape surrounding the periphery of the current sensing region 40. In this case, two groups each including at least two p-type base connection regions 71c, that are adjacent to each other and that sandwich the current sensing region 40 therebetween are disposed in a striped-like planar layout extending along the second direction Y. The four or more p-type base connection regions 71c and the p-type base region 71 (including the p-type base region 71a) forming the MOS gate structure region 70a of the main semiconductor switching element 10 form the concentric circle shape planar layout surrounding the periphery of the current sensing region 40. The second over voltage protection region 90 may be disposed in the concentric circle shape planar layout along the four or more p-type base connection regions 71c and the p-type base region 71 (including the p-type base region 71a) forming the MOS gate structure region 70a of the main semiconductor switching element 10.

As depicted in FIGS. 15 and 16, the second over voltage protection region (fourth semiconductor region) 90 includes an n-type or a p-type first semiconductor region (the fourth semiconductor region) 91. The first semiconductor region 91 is selectively disposed in a portion deeper toward the side of the drain than the p-type base region 71 of the n⁻-type silicon carbide layer 2 (the drift region), at a depth not reaching an interface between the n⁻-type silicon carbide layer 2 and the n⁺-type silicon carbide substrate 1. The first semiconductor region 91 faces in the depth direction Z, the p-type base region 71 constituting the MOS gate structure region 70a of the main semiconductor switching element 10, at the side of the p-type base region 71 closest to the current sensing region 40, and contacts the p-type base region 71 (FIG. 15). The first semiconductor region 91 in addition faces the p-type base connection region 71c in the depth direction Z and contacts the p-type base connection region 71c (FIG. 16).

It is assumed that the second over voltage protection region 90 is disposed in a substantially concentric circle shape surrounding the periphery of the current sensing region 40 as described. Although not depicted, in this case, the first semiconductor region 91 is disposed at each position facing in the depth direction Z, the plural p-type base regions 71 adjacent to each other in the second direction Y, among the p-type base region 71 constituting the MOS gate structure region 70a of the main semiconductor switching element 10.

The dimensions of the current sensing region 40 are each significantly small to be about one thousandth of the dimensions of the main semiconductor switching element 10, and generally, over voltage and surge are easily applied to the current sensing region 40 compared to the main semiconductor switching element 10. In the portion having the first semiconductor region 91 disposed therein, the breakdown voltage of the main semiconductor switching element 10 is set to be lower than the breakdown voltage of the current sensing region 40. The main semiconductor switching element 10 thereby has a structure that tends to absorb the over voltage in the portion having the first semiconductor region 91 disposed therein, and application of over voltage to the current sensing region 40 may be suppressed. The conductivity type (the n type or the p type) of the first semiconductor region 91 may be changed variously based on the design conditions. When the n-type first semiconductor region 91 is disposed, the impurity concentration of the first semiconductor region 91 is set to be higher than the impurity concentration of the drift region (the n⁻-type silicon carbide layer 2).

When the n-type first semiconductor region 91 is disposed, expansion of the depletion layer spreading from the pn-junction between the p-type base region 71 and the first semiconductor region 91 to the side of the drain is suppressed. As a result, the breakdown voltage of the main semiconductor switching element 10 in the portion having the first semiconductor region 91 disposed therein decreases. When the p-type first semiconductor region 91 is disposed, the pn-junction between the first semiconductor region 91 and the drift region is formed at a position deeper toward the side of the drain than the pn-junction between the p-type base region 71 and the drift region. The electric field therefore tends to concentrate at the pn-junction between the first semiconductor region 91 and the drift region, and the breakdown voltage of the main semiconductor switching element 10 in the portion having the first semiconductor region 91 disposed therein decreases. As described, regardless of the conductivity type of the first semiconductor region 91, the breakdown voltage of the main semiconductor switching element 10 in the portion having the first semiconductor region 91 disposed therein may be set to be lower than the breakdown voltage of the current sensing region 40.

A second semiconductor region (fifth semiconductor region) 92 may selectively be disposed inside the first semiconductor region 91 to contact the p-type base region 71. The conductivity type (the n type or the p type) of the second semiconductor region 92 may be changed variously based on the design conditions. For example, the second semiconductor region 92 may be a semiconductor region that has the same conductivity type as that of the first semiconductor region 91 and that has an impurity concentration different from that of the first semiconductor region 91. The second semiconductor region 92 may have the conductivity type different from that of the first semiconductor region 91. The main semiconductor switching element 10 merely has to have a structure that tends to absorb the over voltage in the portion having the first semiconductor region 91 disposed therein, and the conductivity type of the first semiconductor region 91 and whether the second semiconductor region 92 is disposed may be variously changed according to the design conditions. For example, the structure that tends to best absorb the over voltage is a case where only the n-type first semiconductor region 91 constitutes the second over voltage protection region 90.

When the first and the second semiconductor regions 91 and 92 having differing conductivity types constitute the second over voltage protection region 90, the expansion of the depletion layer spreading on the side of the source in the first and the second semiconductor regions 91 and 92 becomes rapid and the rate of absorbing the over voltage becomes rapid. Therefore, the breakdown of the main semiconductor switching element 10 may be expedited in the portion having the second over voltage protection region 90 disposed therein. When the n-type second semiconductor region 92 is disposed in the p-type first semiconductor region 91, the rate of absorbing the over voltage is determined based on the thickness t1 of the second semiconductor region 92. When the p-type second semiconductor region 92 is disposed in the n-type first semiconductor region 91, the rate of absorb the over voltage is determined based on the portion t2 of the first semiconductor region 91, sandwiched by the drift region and the second semiconductor region 92.

The first and the second semiconductor regions 91 and 92 may each be formed using ion implantation. Therefore, the second over voltage protection region 90 may be formed easily by merely adding one ion implantation step for each of the regions 91 and 92 in the method of manufacturing a semiconductor device according to the first embodiment. The ion implantation steps to form the first and the second semiconductor regions 91 and 92 may each be executed at any timing at which an ion implantation step can generally be executed when the acceleration voltage of the ion implantation is properly set. The first and the second semiconductor regions 91 and 92 may be formed even after the p-type base region 71 is formed, by setting the acceleration voltage of each of the ion implantation sessions such that the first and the second semiconductor regions 91 and 92 are formed at predetermined positions deeper than the p-type base region 71 from the front surface of the base body.

The first and the second semiconductor regions 91 and 92 may be formed simultaneously with other semiconductor regions whose ion implantation conditions (the conductivity type, the depth, and the impurity concentration) are same as those thereof. The ion implantation steps to form the first and the second semiconductor regions 91 and 92 may be multi-stage ion implantation (plural ion implantation sessions of differing acceleration voltages and dose amounts). Although not depicted, the planar shape of each the first and the second semiconductor regions 91 and 92 may be changed variously and may be, for example, a substantially rectangular shape, a triangular shape, or a circular shape.

Figure 17:
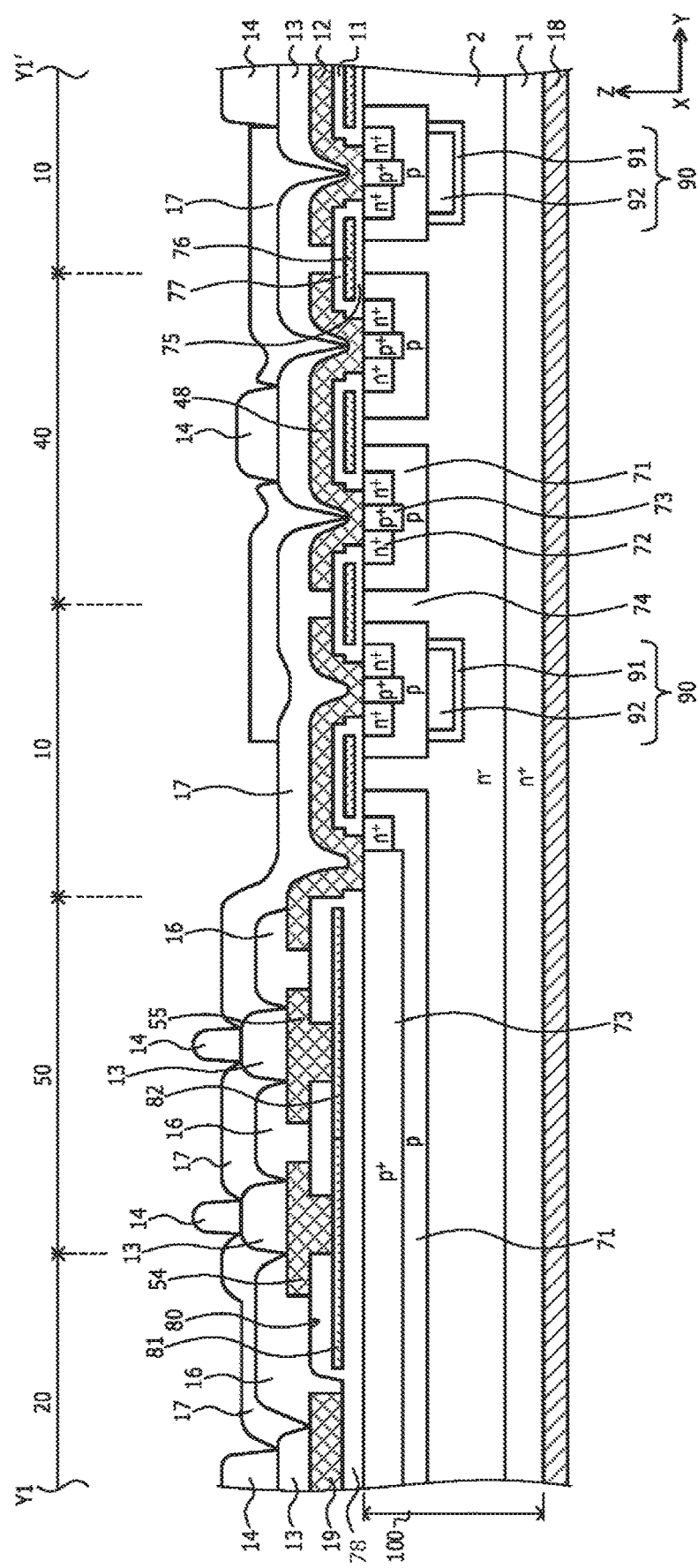
FIG. 17 is a cross-sectional view of another example of the structure of the semiconductor device according to the fourth embodiment.

FIG. 17 is a cross-sectional view of another example of the structure of the semiconductor device according to the fourth embodiment. As depicted in FIG. 17, the portions immediately beneath the gate pad 19, the anode pad 54, and the cathode pad 55 may be used as the ineffective region without disposing therein the semiconductor regions constituting the MOS gate structure region 70a. In this case, the MOS gate structure region 70a of the main semiconductor switching element 10 is disposed to surround the periphery of the MOS gate structure region 70b of the current sensing region 40. The arrangement of the first semiconductor region 91 is as described above. The source pad 12 is disposed to surround only the periphery of the OC pad 48, in a planar layout. The periphery of the electrode pads other than the OC pad 48 may be surrounded by the source pad 12 at a portion different from the OC pad 48.

As described, according to the fourth embodiment, the same effect as that of the first to the third embodiments may be achieved. According to the fourth embodiment, a structure may be established that absorbs the over voltage using the first and the second semiconductor regions of the main semiconductor switching element, disposed in the portion adjacent to the current sensing region, and therefore, the current sensing region may be protected from over voltage.

In the description above, the present invention is not limited to the embodiments and may be changed variously within a scope not departing from the spirit of the present invention. For example, although plural electrode pads other than the source pad are disposed in the embodiments, the reliability of the semiconductor device may be improved even with a configuration having one electrode pad disposed therein in addition to the source pad. Although the description has been made taking the example of a case where the main semiconductor switching element is the planar gate MOSFET, any such semiconductor device having various element structures may be employed as the main semiconductor switching element, such as a bipolar transistor, an IGBT, and a trench gate semiconductor device. The semiconductor element disposed on the same semiconductor chip as the main semiconductor switching element is not limited to the circuit region to protect and control the main semiconductor switching element and may be changed variously. The dimensions, the impurity concentration, and the like of each of the components are set variously corresponding to the required specification and the like. The present invention achieves the same effect even with a semiconductor device using another wide bandgap semiconductor such as gallium nitride (GaN) or the like, or a semiconductor device using silicon. Although the first conductivity type is the n type and the second conductivity type is the p type in the embodiments, the present invention is further applicable when the first conductivity type is the p type and the second conductivity type is the n type.

However, with conventional semiconductor devices, the terminal pins 215 are bonded only to the source electrode (the source pad) 212 and the gate pad of the main semiconductor switching element 210 through the plated film 213 and the solder layer 214. On the other hand, a bonding wire is bonded to an electrode pad of a circuit region not depicted such as a protective circuit, a control circuit, and a computing circuit that are disposed on a single semiconductor chip (the silicon carbide base body 200). Therefore, under a high temperature condition, adhesion between the electrode pad of the circuit region and the bonding wire is degraded and a problem arises in that the reliability of the semiconductor device is degraded.

According to the semiconductor device and the method of manufacturing a semiconductor device of the present invention, a semiconductor device may be produced (manufactured) without using a bonding wire, which has low adhesion with an electrode pad under a high temperature condition, consequently an effect is achieved in that a semiconductor device may be provided that is highly reliable under a high temperature condition.

As described above, the semiconductor device and the method of manufacturing a semiconductor device according to the present invention are useful for a semiconductor device used as a switching device and is especially suitable for a semiconductor device using silicon carbide.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a plurality of semiconductor elements disposed on a single semiconductor substrate comprising a semiconductor material having a bandgap that is wider than that of silicon;
   a plurality of electrode pads that are disposed in a predetermined planar layout on a front surface of the semiconductor substrate, the plurality of electrode pads each being electrically connected to a corresponding one of the plurality of semiconductor elements;
   a second electrode contacting a back surface of the semiconductor substrate, wherein
   each of the plurality of electrode pads is bonded through a plated film to a corresponding terminal pin by solder, thereby to externally carry out voltage of all of the plurality of electrode pads, and
   the plurality of semiconductor elements include a plurality of semiconductor switching elements that include:
      a first semiconductor element having an insulated gate structure, and executing a main operation, the first semiconductor element including:
         a first semiconductor region of a second conductivity type, disposed in a front surface layer of the semiconductor substrate of a first conductivity type;
         a second semiconductor region of the first conductivity type, selectively disposed in the front surface layer of the semiconductor substrate;
         a gate insulating film disposed so as to contact the semiconductor substrate, at a region in which the first semiconductor region is not disposed; and
         a gate electrode disposed on the gate insulating film at a side opposite to the semiconductor substrate; and
      a second semiconductor element having an insulated gate structure, and detecting current flowing through the first semiconductor element, wherein
         a channel length of the second semiconductor element is set such that the first semiconductor element and the second semiconductor element have the same gate threshold voltage,
         the second semiconductor element is configured to carry an electrical current smaller than is the first semiconductor element, the second semiconductor element being made up of a portion of the first semiconductor region and a portion of the second semiconductor region that face, in a depth direction, one of the electrode pads that is electrically connected to the second semiconductor element, and
      the one of the electrode pads electrically connected to the second semiconductor element contacts the first semiconductor region and the second semiconductor region.

2. The semiconductor device according to claim 1, wherein the semiconductor device has a planar layout in which the one of the electrode pads electrically connected to the second semiconductor element is disposed in a central portion of an active region through which main electric current flows.

3. The semiconductor device according to claim 1, wherein the semiconductor device has a planar layout in which some of the electrode pads electrically connected to the plurality of semiconductor elements are disposed in one row in a straight line.

4. The semiconductor device according to claim 1, wherein the semiconductor device has a planar layout in which some of the electrode pads electrically connected to the plurality of semiconductor elements are divided and disposed at two positions sandwiching one of the electrode pads electrically connected to the first semiconductor element.

5. The semiconductor device according to claim 1, wherein the plurality of the semiconductor elements further include at least one of a first over voltage protection region protecting the first semiconductor element from over voltage, a temperature sensing region detecting a temperature of the first semiconductor element or a computing circuit region controlling the first semiconductor element.

6. The semiconductor device according to claim 1, wherein the semiconductor material having a bandgap that is wider than that of silicon is silicon carbide.

7. The semiconductor device according to claim 1, wherein
   an element structure of the first semiconductor element and an element structure of the second semiconductor element are disposed at a predetermined pitch.

8. The semiconductor device according to claim 7, wherein the first semiconductor element and the second semiconductor element are each comprised of a plurality of pieces of element, one or more of which are commonly used for both of the first semiconductor element and the second semiconductor element.

9. The semiconductor device according to claim 1, wherein the first semiconductor element further includes
   a third semiconductor region of the second conductivity type, disposed in the front surface layer of the semiconductor substrate, the first and second semiconductor regions being disposed in a front surface layer of the third semiconductor region, and
   a fourth semiconductor region selectively disposed at a position deeper than the third semiconductor region from the front surface of the semiconductor substrate, the fourth semiconductor region contacting the third semiconductor region.

10. The semiconductor device according to claim 9, wherein a fifth semiconductor region of a conductivity type different from that of the fourth semiconductor region is selectively disposed in the fourth semiconductor region.

11. The semiconductor device according to claim 1, wherein the first semiconductor region includes a plurality of first semiconductor regions, and the second semiconductor regions includes a plurality of second semiconductor regions, the first semiconductor element further includes
- a plurality of third semiconductor regions of the second conductivity type, disposed in the front surface layer of the semiconductor substrate, one of the first semiconductor regions and one of the second semiconductor regions being disposed in a front surface layer of a corresponding one of the third semiconductor regions, and
- a fourth semiconductor region selectively disposed at a position deeper than one of the third semiconductor regions from the front surface of the semiconductor substrate, the one of the third semiconductor regions being disposed at a position closest to the second semiconductor element.

12. The semiconductor device according to claim 1, wherein the channel length of the second semiconductor element is different from a channel length of the first semiconductor element to set the first and second semiconductor elements to have the same gate threshold voltage.

13. The semiconductor device according to claim 1, wherein the first semiconductor element and the second semiconductor element have a common drain electrode.

14. A semiconductor device, comprising:
- a plurality of semiconductor elements disposed on a single semiconductor substrate comprising a semiconductor material having a bandgap that is wider than that of silicon;
- a plurality of electrode pads that are disposed in a predetermined planar layout on a front surface of the semiconductor substrate, the plurality of electrode pads each being electrically connected to a corresponding one of the plurality of semiconductor elements;
- a second electrode contacting a back surface of the semiconductor substrate, wherein each of the plurality of electrode pads is bonded through a plated film to a corresponding terminal pin, thereby to externally carry out voltage of all of the plurality of electrode pads, and the plurality of semiconductor elements include a plurality of semiconductor switching elements that include:
- a first semiconductor element having an insulated gate structure, and executing a main operation, the first semiconductor element including:
  - a first semiconductor region of a second conductivity type, disposed in a front surface layer of the semiconductor substrate of a first conductivity type;
  - a second semiconductor region of the first conductivity type, selectively disposed in the front surface layer of the semiconductor substrate;
  - a gate insulating film disposed so as to contact the semiconductor substrate, at a region in which the first semiconductor region is not disposed; and
  - a gate electrode disposed on the gate insulating film at a side opposite to the semiconductor substrate, and
- a second semiconductor element having an insulated gate structure, and detecting current flowing through the first semiconductor element, wherein
- a channel length of the second semiconductor element is set such that the first semiconductor element and the second semiconductor element have the same gate threshold voltage, and the second semiconductor element is configured to carry an electrical current smaller than is the first semiconductor element, the second semiconductor element being made up of a portion of the first semiconductor region and a portion of the second semiconductor region that face, in a depth direction, and the one of the electrode pads electrically connected to the second semiconductor element contacts the first semiconductor region and the second semiconductor region.

15. A semiconductor device, comprising:
- a plurality of semiconductor elements disposed on a single semiconductor substrate comprising a semiconductor material having a bandgap that is wider than that of silicon; and
- a plurality of electrode pads that are disposed in a predetermined planar layout on a front surface of the semiconductor substrate, the plurality of electrode pads each being electrically connected to a corresponding one of the plurality of semiconductor elements, wherein each of the plurality of electrode pads is bonded through a plated film to a corresponding terminal pin by solder, thereby to externally carry out voltage of all of the plurality of electrode pads, and the plurality of semiconductor elements include a plurality of semiconductor switching elements that include:
- a first semiconductor element having an insulated gate structure, and executing a main operation, and
- a second semiconductor element having an insulated gate structure, and detecting current flowing through the first semiconductor element, and a channel length of the second semiconductor element is set to compensate for stress to be caused from bonding the corresponding electrode pad of the second semiconductor element to the corresponding terminal pin such that the first semiconductor element and the second semiconductor element each have the same gate threshold voltage.

* * * * *